United States Patent [19]

Caputo et al.

[11] 4,074,358
[45] Feb. 14, 1978

[54] TEST SET FOR MEASURING JITTER DISTORTION OF DATA PULSES

[75] Inventors: Salvatore Caputo, Long Branch; Scott McDowell Fitch, Holmdel, both of N.J.; Cliff Andrew Harris, Albuquerque, N. Mex.; John Kuhar, Jr., Middletown, N.J.; Andrew Leo Pappas, Tinton Falls, N.J.; Wayne Redlich, Freehold, N.J.

[73] Assignee: Bell Telephone Laboratories, Incorporated, Murray Hill, N.J.

[21] Appl. No.: 746,809

[22] Filed: Dec. 2, 1976

[51] Int. Cl.² .................... G01R 29/02; H04B 15/00; G06F 15/20

[52] U.S. Cl. .................................. 364/514; 364/701; 328/112; 307/234

[58] Field of Search ............. 235/151.31, 151.3, 150.3; 324/186; 328/112; 307/234; 178/69 A

[56] References Cited

U.S. PATENT DOCUMENTS

| | | | |
|---|---|---|---|
| 3,040,983 | 6/1962 | Bigelow | 235/150.3 X |
| 3,155,772 | 11/1964 | Gibby et al. | 178/69 |
| 3,473,115 | 10/1969 | Oliver | 328/112 X |
| 3,496,462 | 2/1970 | Maniere et al. | 324/68 |
| 3,496,536 | 2/1970 | Wheeler et al. | 235/150.3 X |
| 3,612,845 | 10/1971 | Lawlor | 235/150.3 X |
| 3,648,688 | 3/1972 | O'Hanlon, Jr. et al. | 128/2.06 A |
| 3,720,871 | 3/1973 | Brown | 235/150.3 X |

Primary Examiner—Edward J. Wise
Attorney, Agent, or Firm—Roy C. Lipton

[57] ABSTRACT

Time jitter distortion of data pulses is measured by a test set which recovers a median leading and a median trailing edge from the data pulses, defines a point of time reference at the midpoint of the median leading and trailing edges, generates a digital representation of one-half the median pulse interval (i.e., the interval from the reference time to the median pulse edge) and digital representations of the intervals from the reference time to the data pulse edges, and calculates the difference between each data pulse digital representation and the half median pulse digital representation to obtain the distortion of each data pulse. The test set displays digital representations of selected ones of the calculated differences in accordance with a counting algorithm of the number of times that each of the various differences are calculated.

17 Claims, 35 Drawing Figures

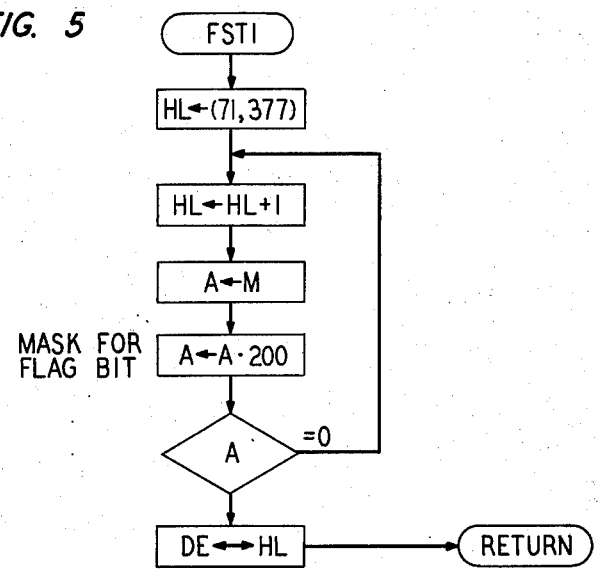
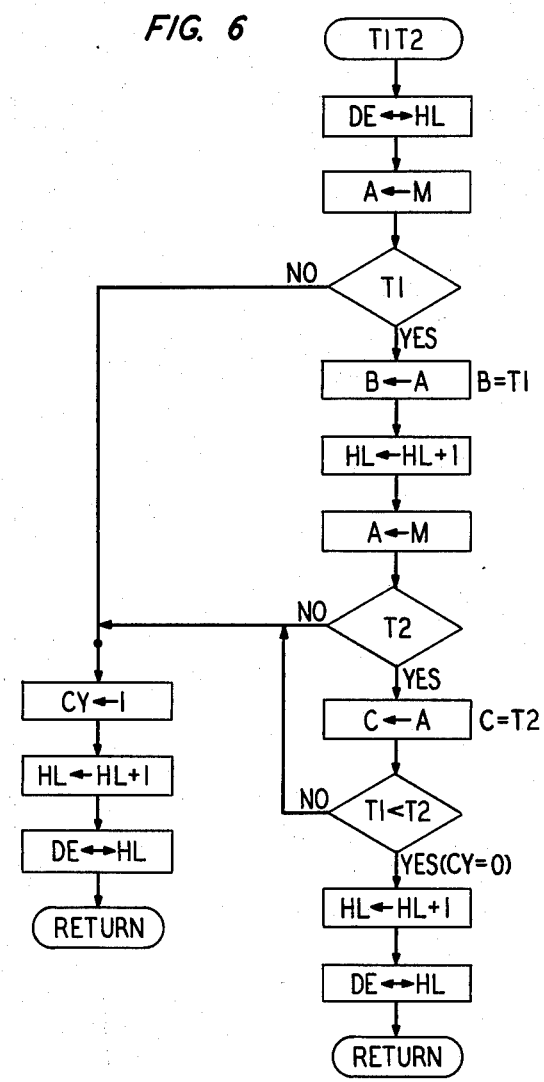

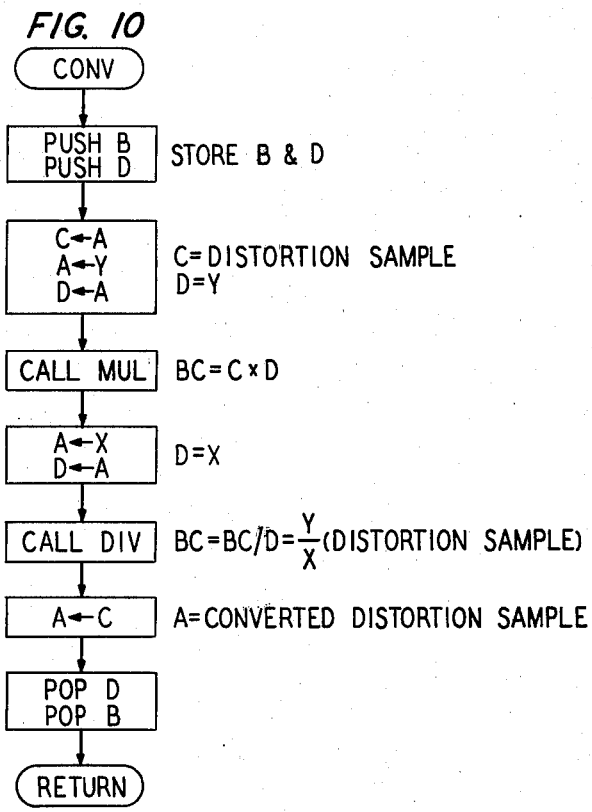
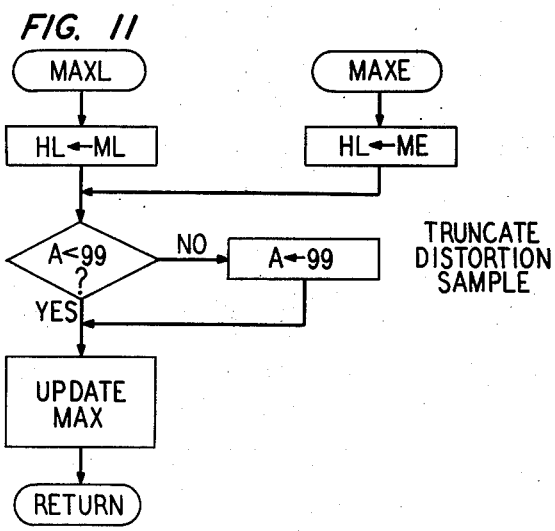

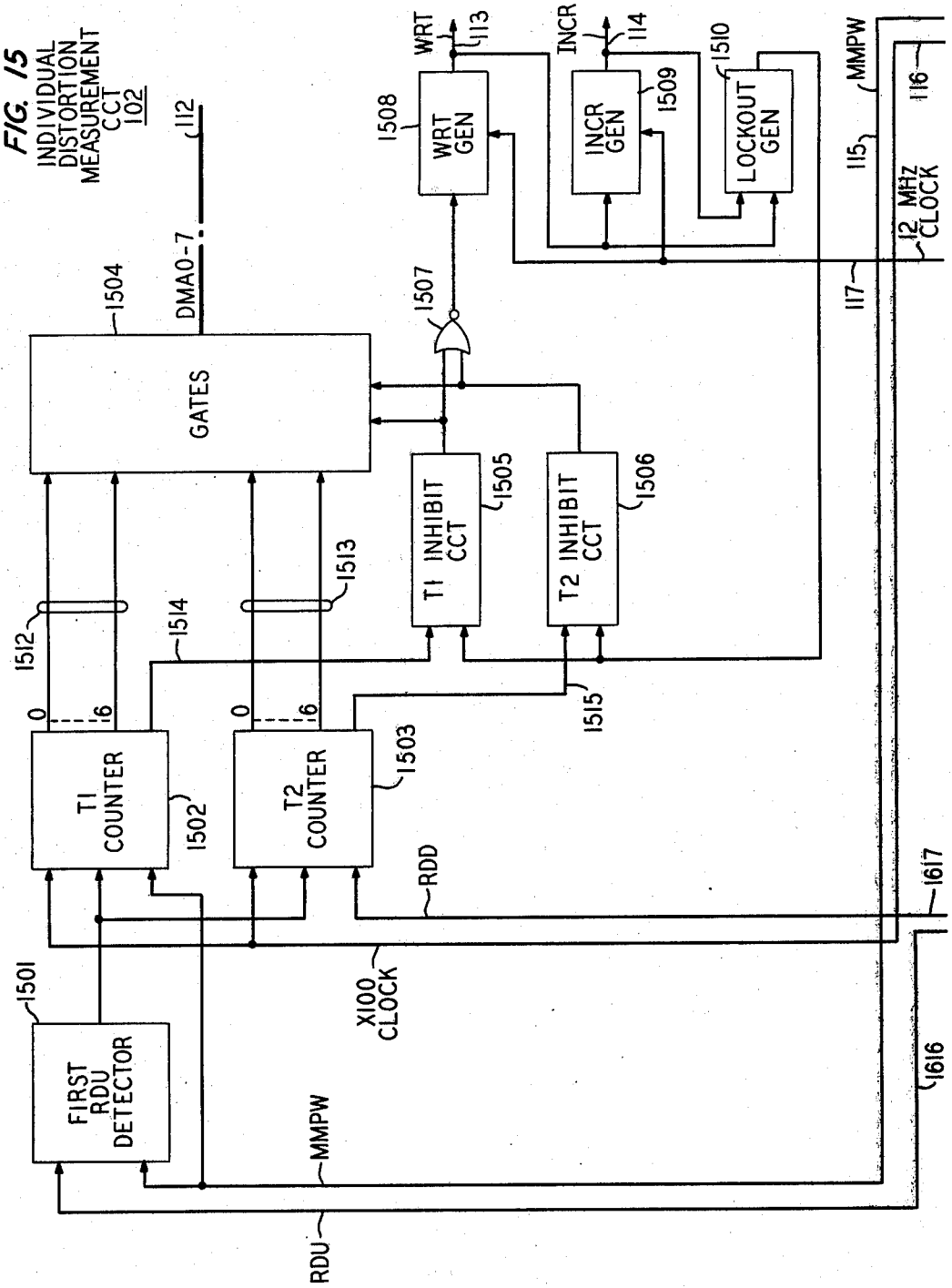

TEST SET FOR MEASURING JITTER DISTORTION OF DATA PULSES

FIELD OF THE INVENTION

This invention relates to measuring jitter distortion of pulses and, more particularly, to a measuring technique which displays an indication of the timing jitter of data pulses.

DESCRIPTION OF THE PRIOR ART

In data pulse transmission systems the data pulses are subject to noise and intersymbol interference. This results in timing jitter distortion of the pulses, which distortion displaces in time the leading and trailing edges of the data pulses. This form of distortion can be observed in an oscilloscope display wherein normal undistorted pulses assume the appearance of a "median" pulse, which is called the eye pattern, and the distorted pulses create "jitter" about the leading and trailing edges of the eye. One might, therefore, determine the quantity of the jitter distortion by noting the number of pulse crossovers at the eye boundary which do not substantially coincide with the crossovers of the median pulse and by observing the spread (or time displacement) of these non-coincident crossovers. A visual measuring scheme, however, requires the presence and attention of the observer and additionally results in subjective (rather than objective) conclusions as to the quantity of the distortion.

Accordingly, it is an object of this invention to objectively measure data pulse jitter distortion without requiring the continuing presence of an observer.

A known technique to measure time distortion which obtains a more objective measurement without requiring the continuing presence of an observer involves sampling the data to be measured at a particular phase of each data pulse and counting each sample which has an instantaneous amplitude which exceeds (or which does not exceed) a fixed threshold. By appropriate adjustment of the threshold amplitude, with respect to the sampling phase, data pulses which substantially coincide with the "median" pulse can be rejected or blocked and a count can be taken of the distorted pulses or those distorted pulses exceeding a fixed time displacement. This known technique does not, however, provide accurate measurement of the time displacement of each pulse and, in addition, this technique requires phase and threshold adjustment for various pulse streams depending on the quantity of noise and interference.

Another known technique involves measuring the time displacement between each data pulse and a "median" or "average" reference pulse recovered from the transition of a plurality of the incoming data pulses, storing the maximum and minimum measurements made and calculating the difference between the maximum and minimum measurements to obtain the spread of the non-coincident pulse crossovers. This technique, however, does not measure the quantity of the noncoincident crossovers. In addition, any noise or interference in the pulse stream eventually "saturates" the measurements by registering excessive maximum and minimum distortion.

Accordingly, it is another object of this invention to automatically and accurately measure distortion.

SUMMARY OF THE INVENTION

These and other objects of this invention are achieved by recovering a standard "median" pulse from the data pulses to be measured, generating digital representations of the relative positions in time of the data pulses and the standard pulse, processing the digital representations to obtain the quantity of the distortion of each data pulse, and compiling the number of times each quantity is obtained. More particularly, a point of time reference is defined, a common digital representation of the interval between the point of time reference and an edge of the median pulse and a plurality of digital representations of the intervals between the point of time reference and corresponding edges of data pulses are generated, and the difference between each of the plurality of digital representations and the common digital representation is calculated to obtain the lead and lag time displacement of each data pulse.

In accordance with a feature of this invention, a count is made of the number of times individual ones of the lead and lag differences are calculated. The count of the largest quantity of lead (and lag) difference is cumulatively summed with the counts of the next successive smaller lead (and lag) differences until the sum exceeds a predetermined number. A digital representation derived from the difference whose count is being summed when the predetermined number is exceeded is displayed. More specifically, the lead quantity being summed when the number is exceeded is added to the lag quantity being summed when the number is exceeded and a digital representation of this addition is displayed. This provides a measurement of a type of jitter distortion called isochronous distortion.

In accordance with the illustrative embodiment of this invention, distortion measurement is provided by a test set which includes a clock circuit that recovers a median leading edge and trailing edge from the leading and trailing edges of the data pulses, defines a point of time reference which is at the midpoint between the median leading and trailing edges and generates a digital representation of one-half the median pulse interval. The test set also includes a measuring circuit that generates digital representations of the intervals between the point of time reference and the leading edges of the data pulses and digital representations of the intervals between the leading edges and trailing edges of the data pulses. The test set further includes a processor that calculates the difference between the digital representation of the interval between each of the data pulse leading edges and the point of time reference and the digital representation of one-half the median pulse to obtain the relative time displacement of each data pulse leading edge. The processor also calculates the difference between the digital representation of the interval between the data pulse leading and trailing edges and the sum of the digital representations of one-half the median pulse and the interval between the data pulse leading edge and the point of time reference to obtain the relative time displacement of each data pulse trailing edge. In addition, the test set includes a display for displaying results derived from selected ones of the calculations.

The foregoing and other objects and features of this invention will be more fully understood from the following description of an illustrative embodiment taken in conjunction with the accompanying drawings.

BRIEF DESCRIPTION OF THE DRAWINGS

In the drawing:

FIGS. 3 through 13 disclose various subroutines of the process;

FIGS. 15 and 16, when arranged as shown in FIG. 14, disclose the various equipments of the distortion measuring circuit and clock circuit of the test set and the manner in which these equipments cooperate.

DETAILED DESCRIPTION

Figure 1:
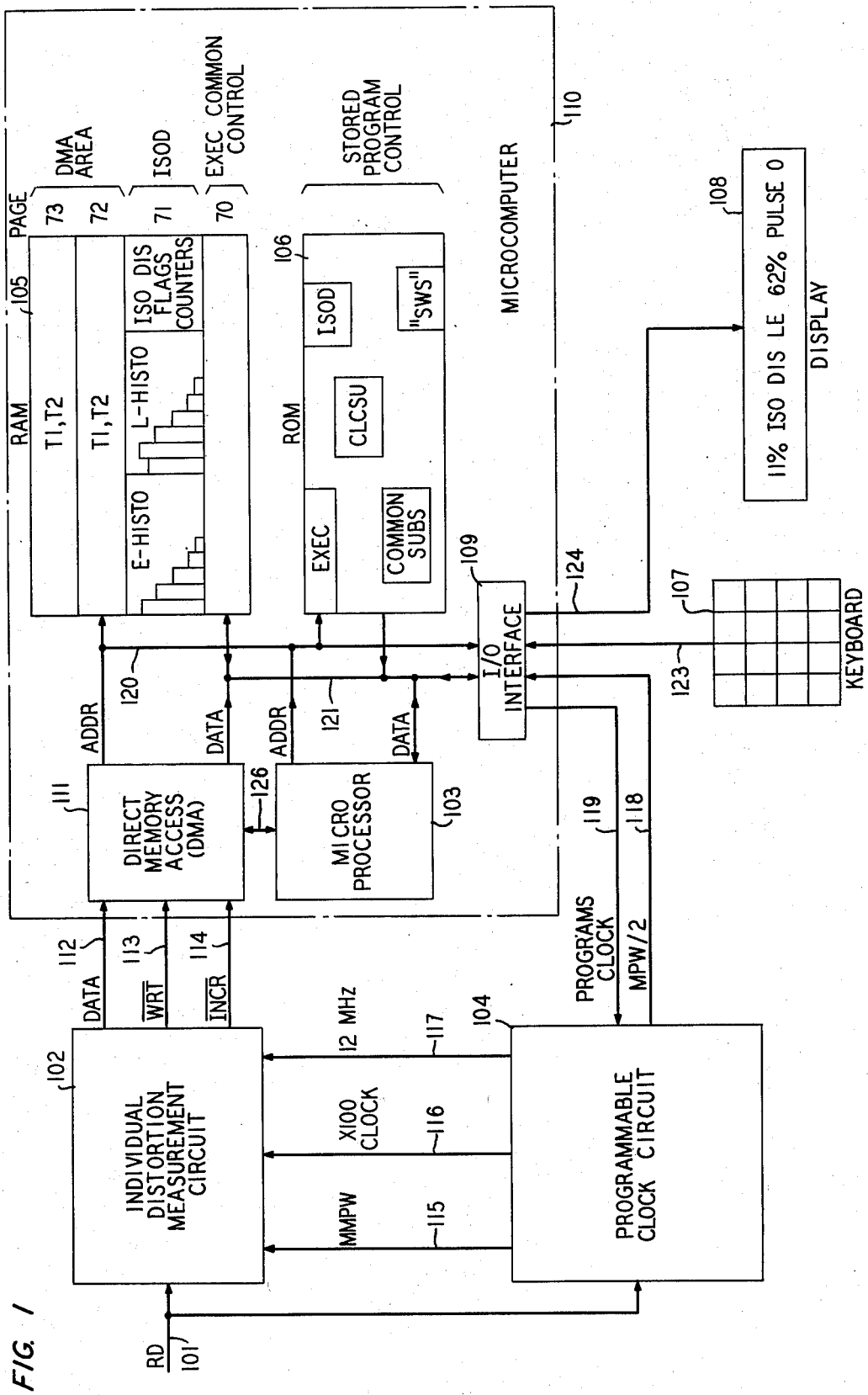
FIG. 1 shows, in block form, the several components of a distortion measuring test in accordance with this invention.

As seen in FIG. 1, the test set generally comprises individual distortion measurement circuit 102, programmable clock circuit 104, microcomputer 110, keyboard 107 and display 108. Microcomputer 110, in turn, comprises microprocessor 103, random access memory (RAM) 105, read-only memory (ROM) 106, input/output (I/O) interface circuit 109 and direct memory access (DMA) circuit 111.

The general function of programmable clock circuit 104 is to recover the clocking signal from an incoming data signal. As seen in FIG. 1, the incoming data signal is received on lead 101 in a manner described hereinafter and this data signal is passed to programmable clock circuit 104.

The incoming data signal may comprise pulse signals of the type described in U.S. Pat. No. 3,787,613 issued to W. D. Farmer, J. G. Kneuer and W. J. Lawless on Jan. 22, 1974. As described in the Farmer et al patent, data signals on a transmission path comprise bipolar pulses. The pulses, in the present arrangement, advantageously may have a bit speed 2.4, 4.8, 9.6 or 56 kilobits per second. As shown in the Farmer et al patent, these pulses are rectified into a rectified pulse stream, the pulses comprising return-to-zero unipolar pulses. These unipolar pulses appear on lead 101 in the present arrangement.

As described in detail hereinafter, the unipolar pulses are timed in programmable clock circuit 104 by a clock recovery circuit. This clock recovery circuit locks to the leading and trailing edges of the incoming pulses on lead 101, generating, over a period of time, pulses corresponding to the median leading and trailing edges of the incoming pulses to thereby produce a median pulse. Programmable clock circuit 104 also includes an internal clock which generates a 12 megahertz clocking signal and countdown circuitry connected to the 12 MHz clock, for generating 100 clock pulses for each element of the incoming data signal.

The clock recovery circuit also finds the midpoint of the median pulse and generates a pulse aligned with this midpoint. Since the incoming data signal may be any one of four speeds, as described above, programmable clock circuit 104 is controlled by control signals on multiple leads 119 which programs the clock circuit to recover the clocking signal and produce the 100 times clock at a speed appropriate to the incoming data. The control signals on lead 119, as described hereinafter, are provided by microcomputer 110. Similarly, programmable clock circuit 104 generates a binary number, derived from the 100 times clock, which defines one-half the length of the median pulse.

The mid-median (midpoint) pulse, the 100 times clock pulse and the 12 MHz clocking signal are passed by programmable clock circuit 104 to distortion measurement circuit 102 by way of leads 115, 116 and 117, respectively. The binary number defining one-half the length of the median pulse is passed to microcomputer 110 by way of multiple leads 118.

Individual distortion measurement circuit 102, as described in detail hereinafter, provides the measurement of the incoming data pulse on lead 101. More specifically, distortion measurement circuit 102 by means of the 100 times clock of clock circuit 104 measures the interval from the leading edge of the data pulse to the trailing edge of the pulse (defined hereinafter as interval T2) and measures the interval between the leading edge of the incoming data pulse and the mid-median (midpoint) of the median pulse (which is defined hereinafter as interval T1). These measurements are available as binary numbers (T1 and T2) under the control of the 100 times clock with a "0" flag bit for the T2 number and a "1" flag bit for the T1 number and the two binary numbers and flag bits are passed by way of multiple leads 112 to microcomputer 110. When the numbers are passed to microcomputer 110, distortion measurement circuit 102, utilizing the 12 MHz clock, provides a write pulse on lead 113 and thereafter an increment pulse on lead 114, both these pulses being passed to microcomputer 110. This distortion measurement of the incoming pulse on lead 101 is repeated for each succeeding individual data pulse received on lead 101 whereby microcomputer 110 is provided, for each pulse, the T1 and T2 measurement described above.

The data and control signals on leads 112, 113 and 114 are passed to direct memory access (DMA) 111 in microprocessor 110. In general, DMA 111 passes the data on leads 112 directly onto DATA bus 121 when provided an enabling signal by microprocessor 103 on lead 126. In addition, when enabled, DMA 111 applies address signals to multiple address leads 120. More particularly, when enabled, DMA 111 applies an initial address "count" (to address a predefined storage position in random access memory 105) and applies the T1 or T2 number on leads 112 to Data bus 121 for loading into random access memory 105 when the "write" signal is applied to lead 113. DMA 111 then increments the address "count" in response to the increment signal on lead 114 (to address the next storage position) and repeats the process until the address count reaches a maximum whereupon the initial address count is restored.

In general, microprocessor 103 processes the data signals on Data bus 121, which may be derived from RAM 105, from programmable clock circuit 104 or from keyboard 107 via interface 109. In addition, microprocessor 103 writes data into and reads data out of random access memory 105 and reads data out of read-only memory 106; the control of the memories being affected by address data applied by microprocessor 103 to Address bus 120. The data read out of the memories is applied to two-way Data bus 121 to microprocessor 103. The data output of microprocessor 103 is passed to two-way Data bus 121 and either to random access memory 105 or through interface 109 to display 108 or to programmable clock circuit 104. A microprocessor suitable for providing this processing of data is the INTEL 8080 manufactured by the Intel Corporation of 365 Bowers Avenue, Santa Clara, Calif. and described on page 629 of the INTEL DATA CATALOG, published in 1975 by the Intel Corporation.

Random access memory (RAM) 105 is a conventional random access memory controlled by address signals on Address bus 120, which address includes read or write signals to either write data from Data bus 121 into memory locations defined by the address data on Address bus 120 or read data out to Data bus 121 from memory locations similarly defined on Address bus 120. As described in more detail hereinafter, random access memory 105 has reserved therein memory locations for storing the T1 and T2 binary number measurements made by individual distortion measurement circuit 102 and for storing "histograms" of calculations performed by microprocessor 103 (described in further detail hereinafter). In addition, RAM 105 has reserved therein memory locations for various flags and counts and routines, as described hereinafter.

Read-only memory (ROM) 106 is arranged to provide program information to microprocessor 103. Microprocessor 103 and read-only memory 106 thereby cooperate to provide the "main" process and subroutines discussed hereinafter. Read-only memory 106 is advantageously constructed in accordance with the program listing in the Appendix of this application. More specifically, ROM 106 is a masked programmable read-only memory which is programmed by mask changes defined by the program in the Appendix. ROM 106 advantageously may comprise the MK28000 ROM of MOSTEK Corporation, constructed and programmed as described in the MOSTEK INTEGRATED CIRCUIT GUIDE published in 1975 by MOSTEK Corporation of Carrollton, Tex.

Interface circuit 109 advantageously comprises a conventional steerable network controlled by signals on Address bus 120 to steer data from keyboard 107 and lead 123 to Data bus 121 and from programmable clock circuit 104 and lead 118 to Data bus 121. Alternatively, the steerable network steers data on Data bus 121 to leads 119 and to leads 124. Leads 124 are connected to a conventional display device, the data on leads 124 being thereby displayed, advising the viewer of distortion information as discussed hereinafter.

Figure 2A:
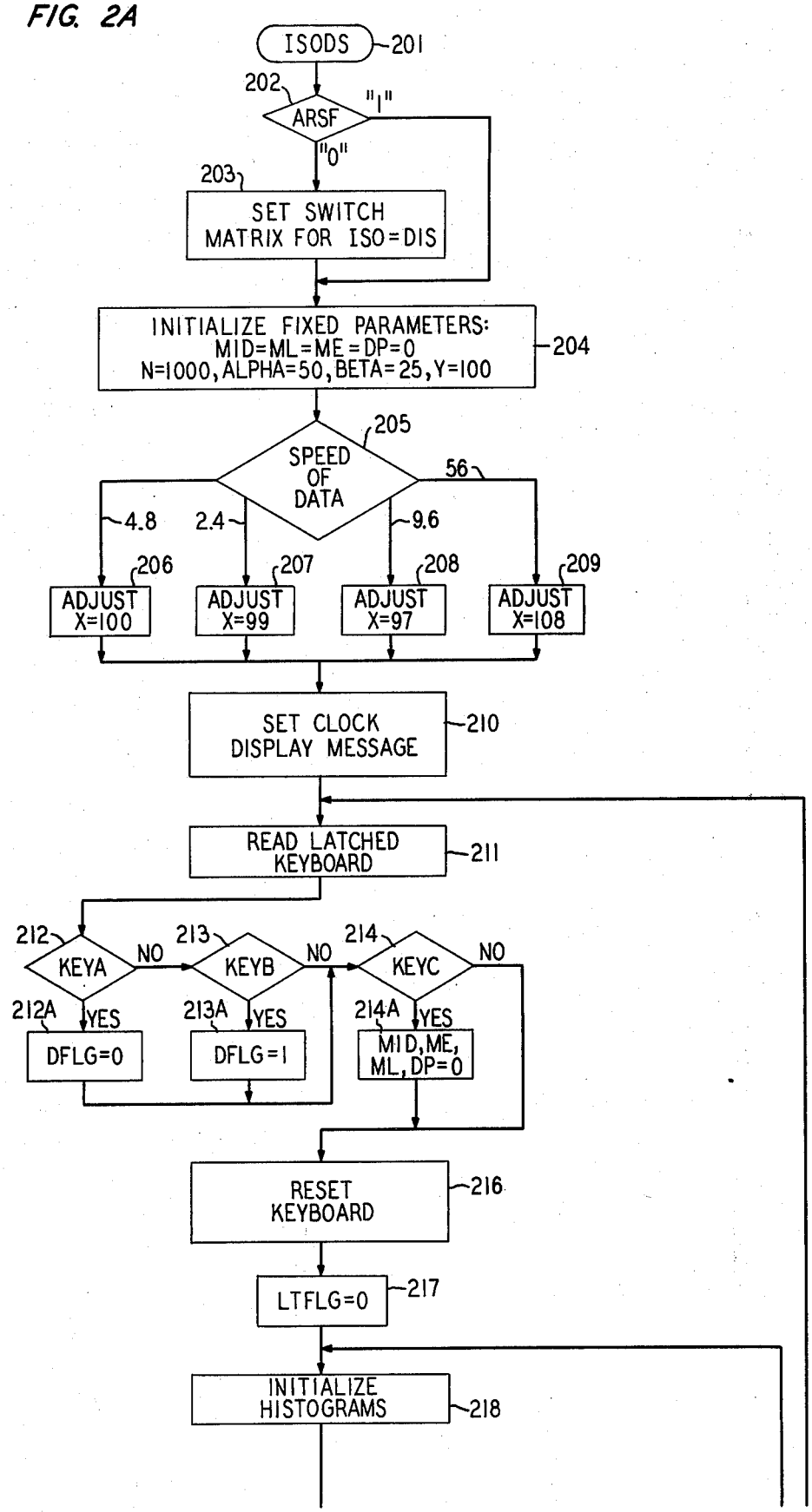
FIGS. 2A and 2B, when vertically aligned, illustrate the process provided by the test set processor.
Figure 2B:
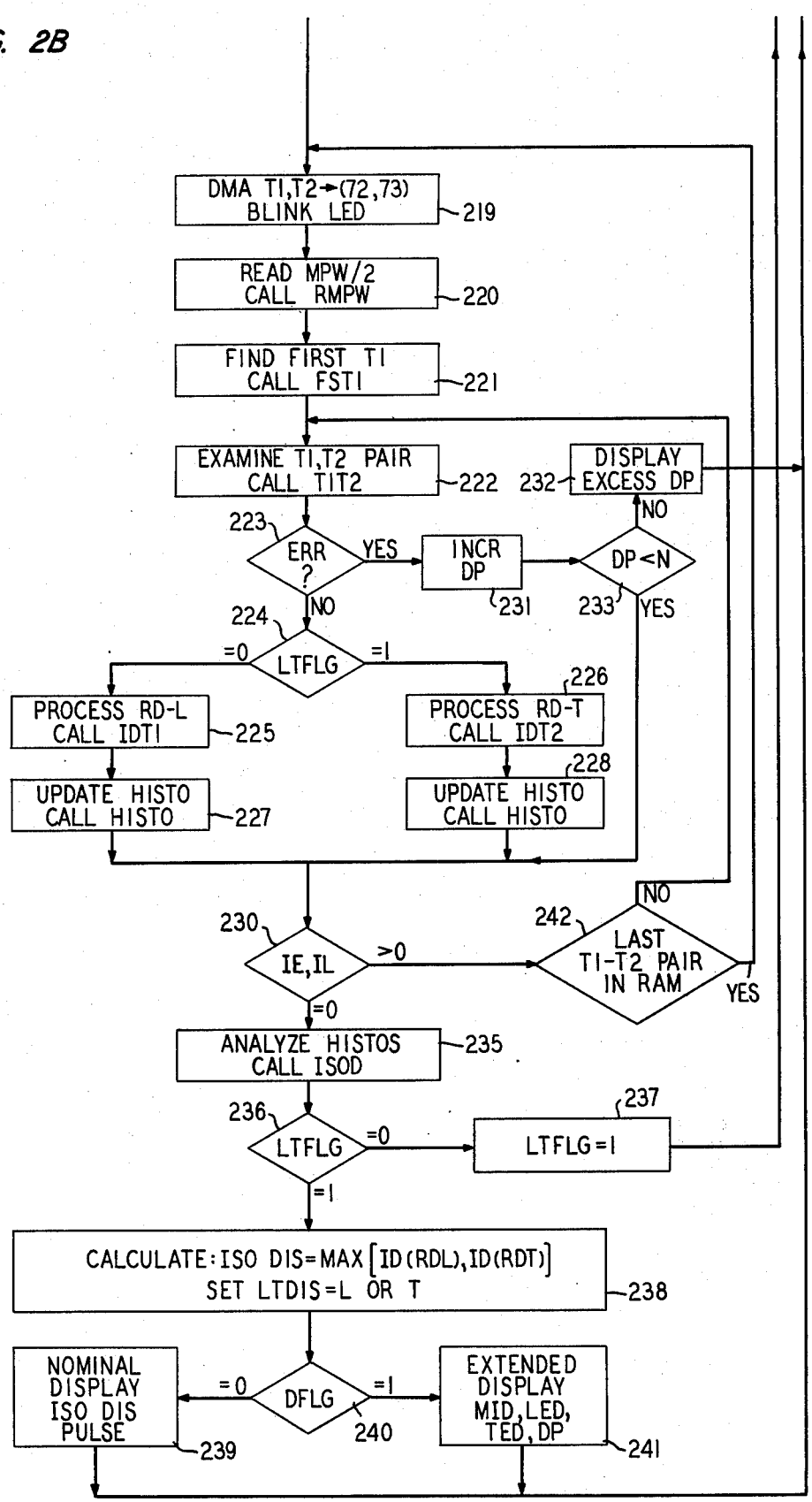

The flow chart for the main process of the test set is shown in FIGS. 2A and 2B, which figures are vertically aligned. The initial condition of the test set is defined in FIG. 2A as "isochronous distortion" entry point 201. At this point, information had previously been derived from keyboard 107 and registered by microprocessor 103 into a predetermined memory location in RAM 105. Such information includes, for example, the speed of the incoming data and the condition or arrangement of the switch network (not shown) interconnecting the incoming transmission line with input lead 101.

With the test set in the initial state at entry point 201, microprocessor 103 examines the memory location in random access memory 105 (identified as location ARSF) defining the condition of the switch network. If a "1" bit is stored in the memory location indicating manual interconnection of the transmission line with input lead 101, the process advances directly to action 204 without modification of the input network. Alternatively, if a "0" bit is in the memory location, the process advances to action 203 and microprocessor 103, by conventional means not shown, operates the switch network to interconnect the incoming transmission line and input lead 101. In either event, the transmission line is connected to lead 101 by way of a network of the type described in the previously described Farmer et al patent and the process thereafter advances to action 204.

Action 204 involves the initialization of the information in random access memory 105. This includes clearing out the information in the histogram storage location of the memory and, in addition, setting certain of the stored counts to appropriate initial counts.

The process now proceeds to decision 205 and then advances along one of four paths depending upon the information stored in RAM 105 specifying the speed of the data, as previously inserted by keyboard 107. If the data speed is 4.8 kilobits per second, the process proceeds to action 207 where an adjustment factor equal to 100 is inserted into random access memory 105. Alternatively, for a speed of 2.4 kilobits per second, the process proceeds to action 207, wherein microprocessor 103 inserts an adjustment factor of 99 into RAM 105. For speeds 9.6 and 56 kilobits per second, adjustment factors of 97 and 108, respectively, are inserted into the memory in accordance with actions 208 and 209. As described in further detail hereinafter, these adjustment factors are made due to a slight error of the 100 times clock resulting from the inability to exactly divide down the 12 MHz clock. These adjustments, as described hereinafter, will be made to the final T1 and T2 number measurements stored in random access memory 105.

With the appropriate adjustment factor now stored in the memory, the process proceeds to action 210. At action 210, microprocessor 103 provides appropriate address information to Address bus 120 to steer data on Data bus 121 to lead 119 through interface 109. Data is applied to Data bus 121 to be passed to programmable clock circuit 104. This programs the clock recovery circuit to lock on the incoming data at the speed of the incoming data and programs the countdown circuit to generate the 100 times clock. Programmable clock circuit 104 is thereby enabled to generate the 100 times clock signal and generate the MMPW signal and the MPW/2 data. At the same time, microprocessor 103 steers display data to lead 124 to display 108 and advantageously displays the words "isochronous distortion".

The process now proceeds to action 211. In accordance with this action, microprocessor 103 applies appropriate address information to interface 109 via Address bus 120 to steer data from the keyboard 107 to Data bus 121. Assume that the user desires a "nominal display", "key A" on the keyboard is depressed, the process having advanced to decision 212 is directed to action 212A. This simple subroutine stores a "0" bit in RAM 105 designating that a nominal display is to be subsequently provided; the process then proceeding to decision 214. In the event that an extended display is desired, "key B" is depressed and decision 212 advances the process to decision 213 which in turn advances the process to action 213A. Action 213A inserts a "1" bit in RAM 105 designating that an extended display is desired whereupon the process advances to decision 214. It is presumed that at this time "key C" on the keyboard has not been depressed whereupon decision 214 advances the process to action 216.

At action 216, microprocessor 103 resets keyboard 107 and advances to action 217. At action 217, microprocessor 103 inserts a "0" bit into a flag location in RAM 105 which in the future will advise the microprocessor to process information received relative to the leading edge of each pulse on lead 101. The processor then proceeds to action 218.

Action 218 involves the initialization of the storage of data in RAM 105 relating to the histories of distortion measurements of the leading and trailing edges of received pulses, hereinafter called histograms. The histograms in this initial part of the process were initialized in action 204 and no further action is performed at this time. The main process of the microprocessor thereupon advances to action 219, shown in FIG. 2B.

Action 219 involves a subroutine wherein the T1 and T2 binary numbers generated by distortion measurement circuit 102 are read, on the fly, and stored in random access memory 105 in the appropriate address positions described above. In accordance with this simple routine, microprocessor 103 enables DMA 111 via lead 126. DMA 111, when enabled, directly loads a T1 or T2 binary number into a first storage position of RAM 105 under control of the write pulse from distortion measurement circuit 102, as previously described. The increment pulse on lead 114 from distortion measurement circuit 102 then advances the address output of DMA 111 whereby the second (or next) binary number (T1 or T2) is loaded into the second storage position of RAM 105. Thus, if a T1 number is loaded into the first storage position, a T2 number is loaded into the second and if a T2 number is loaded into the first position, a T1 number is loaded into the second. This process is repeated 256 times to store 512 binary numbers. The subroutine is completed when the DMA 111 applies a signal to leads 126 that informs the microprocessor 103 that all 512 storage locations have been loaded and the process proceeds to action 220.

Action 220 constitutes a subroutine, described in more detail hereinafter, wherein microprocessor 103 conducts multiple reads of the MPW/2 binary word generated by programmable clock circuit 104 and calculates an MPW word when the readings have small differences from each other. This is to ensure that the data is settled before the distortion measurements are made. When the MPW word is calculated, microprocessor 103 proceeds of action 221.

Action 221 consists of a subroutine, described in further detail hereinafter, wherein microprocessor 103 finds the first T1 binary number stored in RAM 105. After this first T1 binary number is located, the process advances to action 222.

Action 222 comprises a subroutine, described in further detail below, which examines the T1 and T2 number pairs to determine if the numbers are derived from a bad data pulse; a good data pulse having the characteristic that the T2 number is greater than the T1 number. The subroutine provides an indication whether the pair is good or bad. Decision 223 proceeds to decision 224 if the pair is good or to action 231 if the pair is bad.

Assume that the data pulse associated with binary pair T1, T2 is bad. Action 231 involves the incrementing of a count in RAM 105. If the incremented count is in excess of a preset number (N) in RAM 105 (such as the count of 1,000), decision advances the process to action 232 wherein data is passed to display 108 to exhibit this excess and the process returns to action 211 wherein microprocessor 103 awaits new instructions from keyboard 107. In the event that there are no instructions, the process again proceeds as described above to reinitialize the histograms and repeat the above-described process.

In accordance with the present-described process, this has constituted the first examination of the T1, T2 binary number pair. Accordingly, action 231 incremented the count to the first count. Since this count is less than the entered (N) count of 1,000, decision 233 advances the count to decision 230.

Assume now that binary pair T1, T2 is not in error. Decision 223 advances the process to decision 224. This decision upon determining that the leading flag bit "0" has been inserted in RAM 105 to examine the leading edge advances the process to action 225. This action is a subroutine, described in further detail hereinafter, wherein an individual leading edge distortion is calculated from the T1, T2 pair. This leading edge distortion calculation is in accordance with the expression:

$$T1 - MPW/2. \tag{1}$$

If the expression is greater than zero, this constitutes early distortion since the measurement T1, which is from the leading edge to the "expected midpoint" (MMPW) of the recovered pulse is greater than the measurement MPW/2, which is one-half the median recovered pulse. Conversely, if this expression is less than zero, this constitutes late distortion.

The process now proceeds to action 227 which constitutes a subroutine, described further hereinafter, wherein the data derived from the above-described expression is inserted in the appropriate bin or storage area in RAM 105 reserved for the early and late histograms. In addition, during the subroutine a count of the number of early (or late) distortion measurements is decremented from a maximum of, for example, 1,000 towards zero.

The process now proceeds to decision 230. If either the early or the late counts exceed "0" indicating counts of less than 1,000, the process further proceeds to decision 242. If the last T1, T2 pair that is stored in RAM 105 has not been read, the process returns to action 222 and the next T1, T2 number pair stored in RAM 105 is examined and the process of calculating the distortion and updating the histogram is repeated. In the event that the last T1, T2 pair stored in RAM 105 has been read, the process returns to action 219 where another 512 T1, T2 binary numbers are loaded into RAM 105 and the processing of these new numbers proceed in the same way as the initial 512 numbers were processed.

During the subroutine of action 227 a count is maintained for each early and late distortion measurement as previously noted. As part of the routine, after 1,000 early or late measurements have been accumulated, the subroutine ceases to enter these measurements in the histogram bin. Decision 230 continues to advance the process to decision 242 to loop back to action 219 and 222, however, so long as there has been less than 1,000 of the other type of distortion calculated. The subroutine of action 227 therefore continues to calculate distortion measurements until there are both 1,000 early and 1,000 late measurements. Decision 230 thereupon advances the process to action 235.

Action 235 constitutes a subroutine which calculates a number defining the distortion of, in this case, the leading edges of the data pulses from a spread of the early and late distortion measurements. As described in further detail hereinafter, the subroutine discards a fixed number of the extremes of the early and late distortion measurements and then provides a number defining the distance between the largest early and the largest late distortion measurement remaining. This distortion measurement is then, in accordance with the subroutine, stored in RAM 105 is shown in detail in FIG. 5. At the point where the subroutine enters from the main process a number is entered which defines the address location in RAM 105 immediately preceeding the address of the first number (T1 or T2) obtained from distortion measurement circuit 102. This address number is incremented by the subroutine and the T1 or T2 number is read by microprocessor 103 from the RAM at this incremented address. The flag bit of the T1 or T2 number is examined and, if the number is "0" indicating a T2 number, the subroutine is repeated by again incrementing the address and reading the number out from the RAM at the next address location. If the flag bit indicates a T1 number, however, this address is stored by the microprocessor and the subroutine returns to the main process.

The subroutine T1, T2 of action 222 which examines the T1 and T2 numbers to ensure that the first number in the pair is T1 number and that the T1, T2 number pair is not in error indicating that the data pulse is valid is shown in FIG. 6. At the point where the subroutine enters from the main process the incremented address stored by the microprocessor is obtained and the T1 (or T2) number at the address is read from the RAM. If the flag bit of the number does not identify the number as a T1 number, the subroutine sets a carry flag to "1", increments the address and reregisters the incremented address, returning to the main process with the carry flag set to "1" to indicate that the data pulse is "bad". If the flag bit of the number designates a T1 number, the subroutine stores the T1 number in a "B" register, increments the address and reads the number from that incremented address of the RAM. In the event that this second number has a flag bit that does not designate a T2 number, the carry flag is set to "1", the address is incremented and replaced and the subroutine returns to the main process. If, however, the flag bit designates a T2 number, this number is stored in a "C" register and the two numbers are compared to determined if the T2 number is greater than the T1 number.

In the event that T2 is not greater than T1, the carry flag is set to "1", the address is incremented and the subroutine returns to the main process as previously described. If the T2 is greater than T1, the address is incremented by "1" and stored by the microprocessor. The subroutine thereupon returns to the main process and, since the carry flag has not been set to "1", it therefore remains at zero to indicate that the data pulse is "good".

Figure 7:
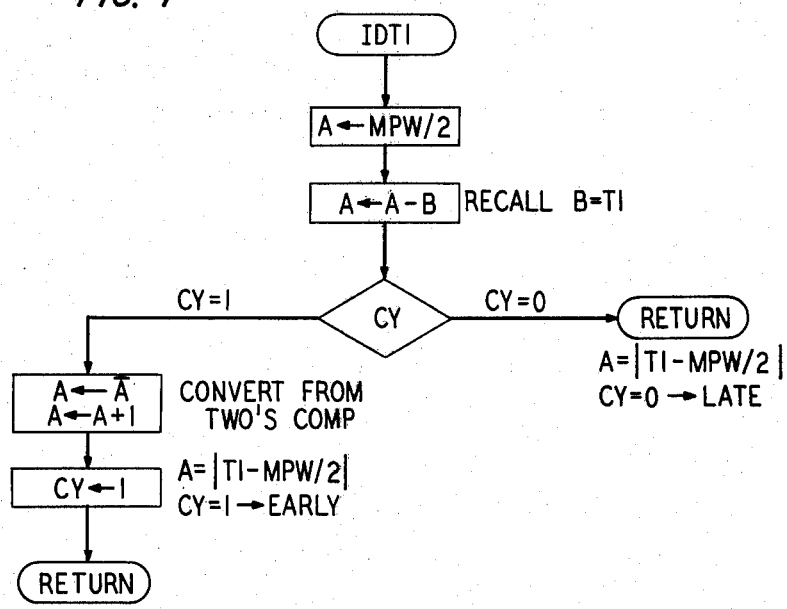

The IDTI subroutine of action 225 which calculates an individual leading edge distortion sample from a T1, T2 pair is shown in FIG. 7. When the subroutine enters from the main process, the MPW/2 number is entered into the microprocessor accumulator. The T1 number previously entered into the "B" register is subtracted from the MPW/2 number. If the resultant difference is positive, the subroutine returns to the main process and at this time the accumulator contains the number corresponding to the expression $$| T1 - MPW/2 |$$

and the carry bit is "0", which information defines late distortion and is used in the main process, as previously described. If the difference between the MPW/2 number and the T1 number is negative (the carry number is "1"), indicating early distortion, the accumulated negative number is inverted and incremented by one to thereby obtain the corresponding positive number and the carry flag is set to "1" whereupon the subroutine returns to the main process. Thus, at this time, the accumulator contains the number corresponding to the expression $$| T1 - MPW/2 |$$

and the carry bit is "1" indicating early distortion.

Figure 8:
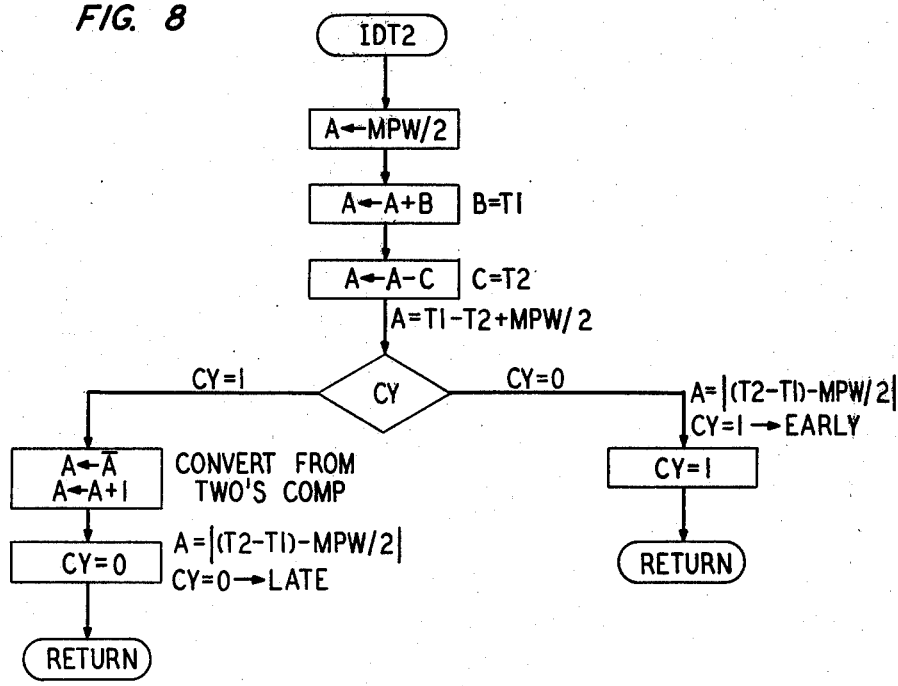

The IDT2 subroutine of action 226 which calculates an individual trailing edge distortion sample from the T1, T2 pair is shown in FIG. 8. When the subroutine enters from the main process, the MPW/2 number is entered into the accumulator, the T1 number in the "B" register is added to the number in the accumulator and the T2 number in the "C" register is subtracted from the sum. If the resultant number is positive (the carry number is "0"), this indicates early distortion and the subroutine sets the carry number to "1" and returns to the main process for processing this information, as previously described. Thus, at this time, the accumulator contains the number corresponding to the expression $$| (T2 - T1) - MPW/2 |.$$

If the resultant number is negative (the carry number is "1") indicating late distortion, the accumulated number is inverted and incremented by one to obtain the corresponding positive number. The carry bit is set to "0" and the subroutine returns to the main process. Thus, at this time, the accumulator contains the number corresponding to the expression $$| (T2 - T1) - MPW/2 |.$$

Figure 9:
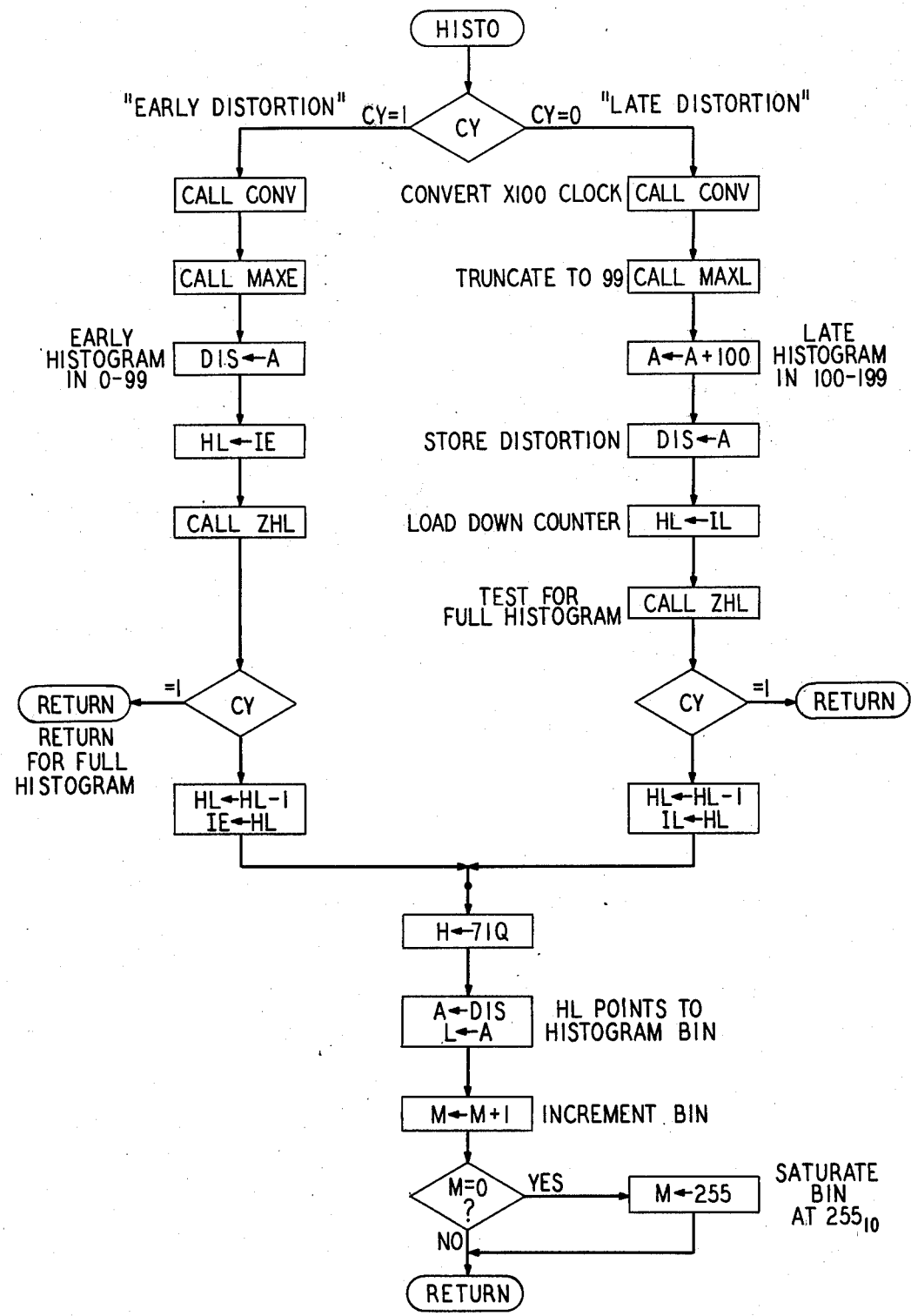

The subroutine for action 235 which calculates the distortion measurement number and which increments the histogram bin that corresponds to the value of the distortion sample is shown in FIG. 9. At the entry point of the subroutine a decision is made as to whether the distortion is early or late. If the distortion is early distortion, the process proceeds (to the left as seen in FIG. 9) through a first action, which subroutine (CONV) adjusts the distortion number by multiplying it with the adjustment factor. Details of this first action are shown in FIG. 10. As can be seen in FIG. 10, the distortion sample number is multiplied with the Y factor which, as previously described with respect to action 204, equals 100. The adjustment factor is then obtained and divided into the quotient of the distortion sample number and the Y factor. Accordingly, the resultant number is the distortion sample number multiplied by 100 over the adjustment factor. This adjusted or converted distortion sample number is then registered and the subroutine returns to the HISTO subroutine.

In the HISTO subroutine, the adjusted distortion sample number is examined in a second action, which subroutine (MAXE) truncates all samples exceeding 99 (the maximum distortion number), converting these samples to 99. The subroutine for this second action is shown in detail in FIG. 11. At this time, as described above, subroutine HISTO (FIG. 9) is following the process for determining early distortion. Accordingly, the entry point of the subroutine is MAXE. At this point of the process, the maximum distortion value stored in RAM 105 is obtained by the microprocessor. Since this is the first measurement, the initialization of RAM 105 has set a count of "0" into storage location ME. This "0" count is therefore now registered by the stored in RAM 105 and the process proceeds to decision 236.

Decision 236 advances the process to action 237 if the "leading/trailing" flag is "0" or to action 238 if the "leading/trailing" flag is "1". If, as previously described, the leading edge distortion is being measured, the flag stored in RAM 105 is "0" and the process thereupon proceeds to action 237 which provides a simple subroutine changing the "leading/trailing" flag to "1" and advancing the process back to action 218. Action 218, as previously described, initializes the histogram bin by clearing out the measurements stored therein. The T1, T2 numbers from the distortion measurement circuit are then again loaded into RAM 105, the MPW/2 word is again calculated and the first T1 number is again located in RAM 105. At this time the process has advanced to action 222 where the T1, T2 number pair is examined and, assuming there is no error, decision 224 advances the process to action 226.

Action 226 involves a subroutine described in further detail below for calculating an individual trailing edge distortion. This calculation is defined by the expression:

$$(T2 - T1) - MPW/2. \qquad (2)$$

A portion of the expression, $T2 - T1$, comprises a number which defines the distance between the "expected midpoint" (MMPW) of the recovered pulse and the trailing edge of the data pulse. If this measurement is greater than the measurement (MPW/2) of one-half the median recovered pulse, then the trailing edge is late and there is late distortion. Alternatively, if the value is less than one-half the median recovered pulse, there is early distortion. In accordance with the subroutine, this calculation is stored in the appropriate bin in RAM 105 and an early or late counter is updated from a count of 1,000 towards zero whereupon the process advances to decision 230.

Assuming that there have been less than 1,000 measurements of either early or late distortion, the process advances to decision 242 which loops back to action 222 if the last T1, T2 pair has not been examined or loops back to action 219 if the last T1, T2 pair has been examined to clear out the T1, T2 numbers from the RAM and load in the next 256 pairs. This process of examining the pulses for early or late distortion of the trailing edge of each pulse thus continues until 1,000 readings of both early and late have been calculated and stored. At this point decision 230 advances the process to action 235 which calculates the distortion spread of the trailing edges, which distance spread is then stored advancing the process to decision 236. Since the LT flag is now "1", as previously described, the process continues to action 238.

Action 238 constitutes a calculation for comparing the leading and trailing edge distortion measurements to determine the measurement with the maximum distortion value and registering that value together with an indication whether this measurement is the distortion of the leading or the trailing edge. Under the presumed condition that a display flag of "0" is stored, decision 240 advances the process to action 239 which sends data to display 108 to display the registered distortion measurement together with the indication whether it is leading or trailing edge distortion. The process then loops back to action 211 and the next set of distortion measurement is made.

In the event that a display flag of "1" is stored, decision 240 advances the process to action 241 whereupon the microprocessor provides an extended display. This extended display will include both the leading edge and trailing edge distortion measurements and the number of T1, T2 pairs discarded by the process following the loop which includes decision 223 and action 231. In addition, the maximum "isochronous distortion" measurement encountered is also displayed.

The clearing of the various measurements and counts is provided by the operation of "key C" in keyboard 107, functionally read in action 211. The process eventually reaches decision 214 which advances the process to action 214A whereupon measurements and counts stored in RAM 105 are cleared out, these counts and measurements reset in the same manner that action 204 initialized the fixed perimeters and the process proceeds to action 219 whereupon the T1 and T2 numbers are again stored and new sets of measurements made.

Figure 3:
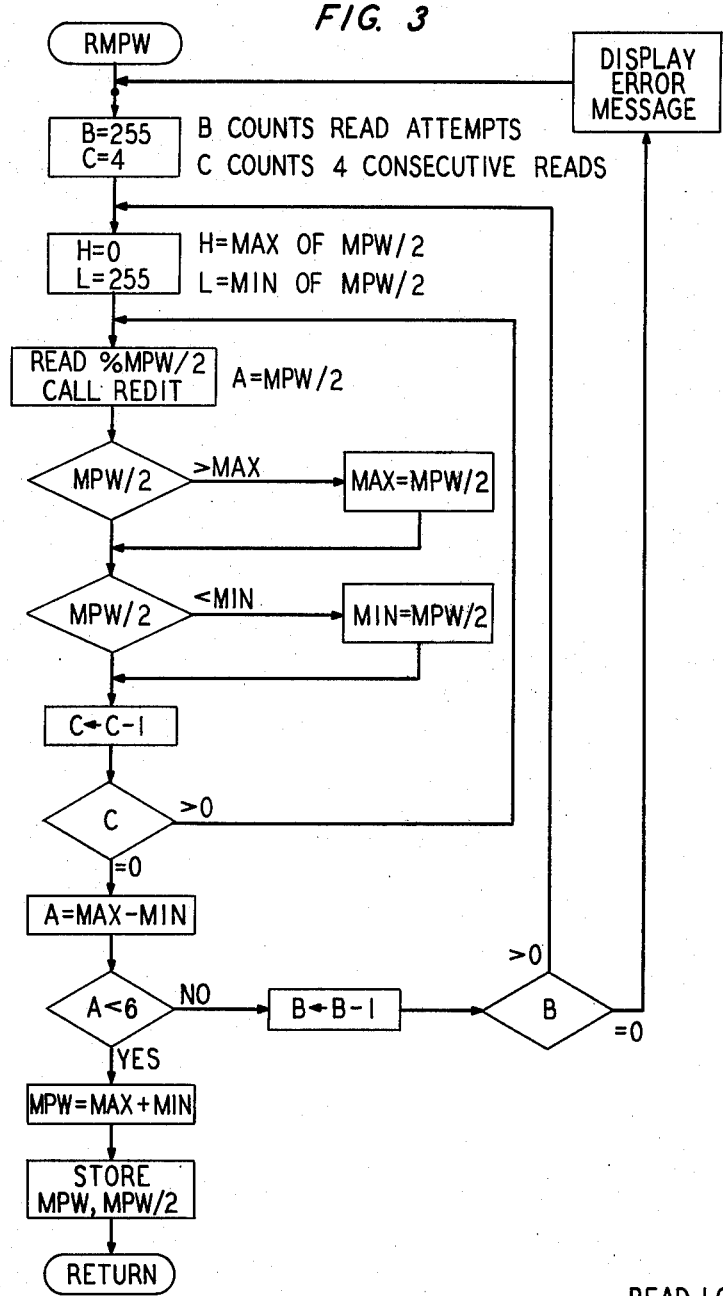
Figure 4:
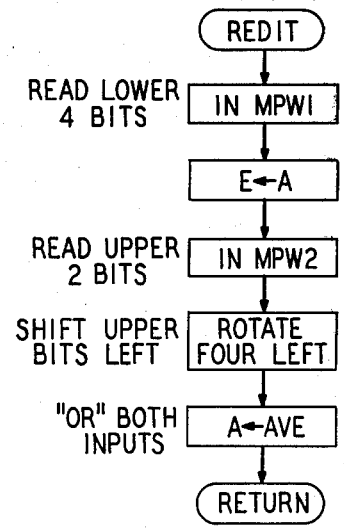

The subroutine of action 220 which reads the numbers generated by programmable clock circuit 104 defining one-half the median recovered pulse and which stores a corrected number in RAM 105 is shown in FIG. 3. The MPW/2 numbers are being read on the fly and the purpose of this subroutine is to read four consecutive numbers to ensure that the data is being read at a stable period and not when an adjustment is being made for the MPW/2 number. As seen in FIG. 3, at the entry point of the subroutine a "reads attempt" count B (of 255) and a "consecutive reads" count C (of four) is registered in microprocessor 103. Thereafter, a maximum MPE/2 number of zero and a minimum MPW/2 number of 255 are registered. A subroutine of reading and registering in microprocessor 103 the MPW/2 number from programmable clock circuit 104 is then followed as shown in further detail in FIG. 4. Thereafter, the MPW/2 number is compared with the maximum number (which is now "0") and if the MPW/2 number exceeds the maximum number, the maximum number is updated by being replaced with the MPW/2 number. The MPW/2 number is then compared with the minimum number (which is now 255) and, if the MPW/2 number is less than the minimum number, the minimum number is updated. It is apparent that this first MPW/2 number is always entered in at least one of the two (most likely both) registers. The C count is then decremented down one and the process of reading, comparing and updating the maximum and minimum numbers is repeated four times. After four updates, the spread between the maximum and minimum number is calculated and, if this spread is greater than six, the B count is decremented down one, the maximum count is set back to zero, the minimum count is set back to 255 and the process of reading, comparing and updating is again repeated four times. In the event that the spread exceeds six for 256 consecutive times, decrementing the B count to zero, an error message is displayed advising the user that a stable count has not been achieved and the process is reinitialized at the point where the B count is reset to 255 and the C count is reset to four. In the event, however, that a spread of less than six is achieved, the MPW number is determined by summing the updated maximum number with the updated minimum number. This number together with the MPW/2 number (which is one-half the MPW number) is then stored in RAM 105. At this point the subroutine ends and the microprocessor returns to the main process.

The FSTI subroutine of action 221 which finds the first T1 number in the block of T1 and T2 numbers microprocessor. The process now examines the distortion sample periodically stored in the accumulator. If this sample is greater than 99, the stored sample value is fixed at 99 and the process proceeds to update the maximum distortion register. If this sample is less than 99, the distortion sample value is retained and the process similarly updates the maximum value. The subroutine for updating the maximum distortion comprises a simple routine for examining the maximum distortion value priorly written into location ME and retaining this value if it exceeds the present sample or alternatively updating with the present value if it exceeds the prior maximum sample calculated. This updated maximum distortion value is written into RAM 105 and is not further used in the present process but is retained in anticipation of future options or expansion of the process. At this point the subroutine returns to the HISTO subroutine.

The HISTO subroutine (FIG. 9) now obtains the adjusted and truncated distortion sample in the accumulator and places it in RAM 105. A value (IE) is obtained from a storage location in RAM 105, which value defines the number of times that an "early" distortion calculation has been made. An action (of simple nature) determines if this number value has reached "0". In the event that "0" has been reached, the carry flag is set to "1" and the subroutine returns to the main process. Alternatively, if the number value has not yet reached "0", the subroutine proceeds to decrement the count by one. The process now points to the storage locations (or page numbers) which contain the histograms. The distortion of the present sample is recovered from RAM 105 and registered in the accumulator of the microprocessor. Since this calculated value defines the specific histogram bin or storage location, the microprocessor is now enabled to point to the specific page and bin number and thereupon increments the number or count in the bin by "1". Since at initialization the bin count was set to "0", the first incrementing of the bin will set the count of "1". The next decision in the subroutine examines the bin count and, if it is not "0", the subroutine returns to the main process. Alternatively, in the event that prior distortion samples have been taken and the bin count has been incremented to provide a count of 256, then the bin count saturates and the count would normally return to "0". In that event the bin count is set back to 255 which defines the maximum count for the bin and the subroutine returns to the main process.

If the distortion sample taken constituted "late" distortion, the carry flag had been set to "0" as previously described. Accordingly, at entry point HISTO the subroutine proceeds through the "late" distortion portion thereof, as seen in FIG. 9. This "late" portion is substantially identical to the subroutine for "early" distortion with the exception that after the routine for truncating the "late" distortion sample is completed, a count of 100 is added to the accumulator, increasing the distortion value by this figure. This addition is provided so that the process will point at the late histogram bins whose numbers start at 100. Otherwise, the subroutine for calculating the "late" distortion is the same as the subroutine for calculating "early" distortion with the exception that the "late" count of samples taken is decremented rather than the "early" count.

Figure 12:
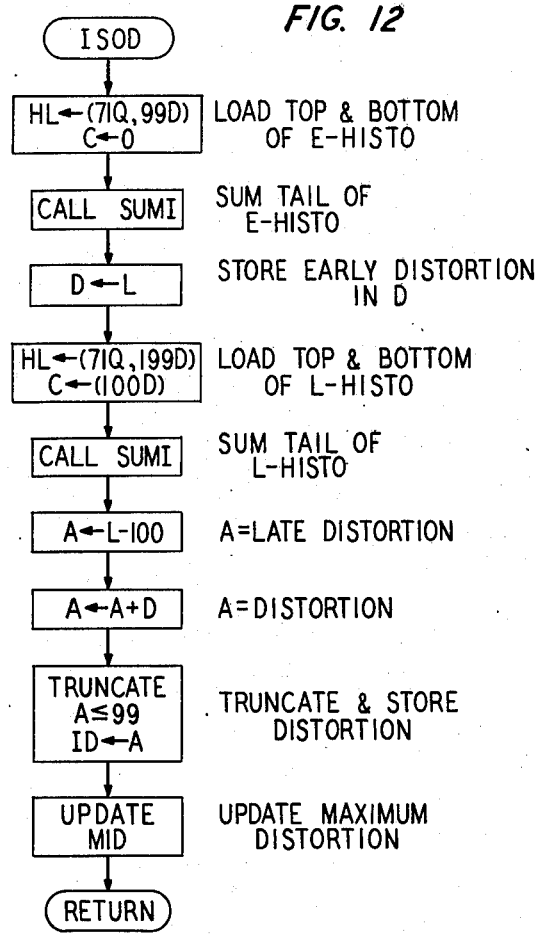
Figure 13:
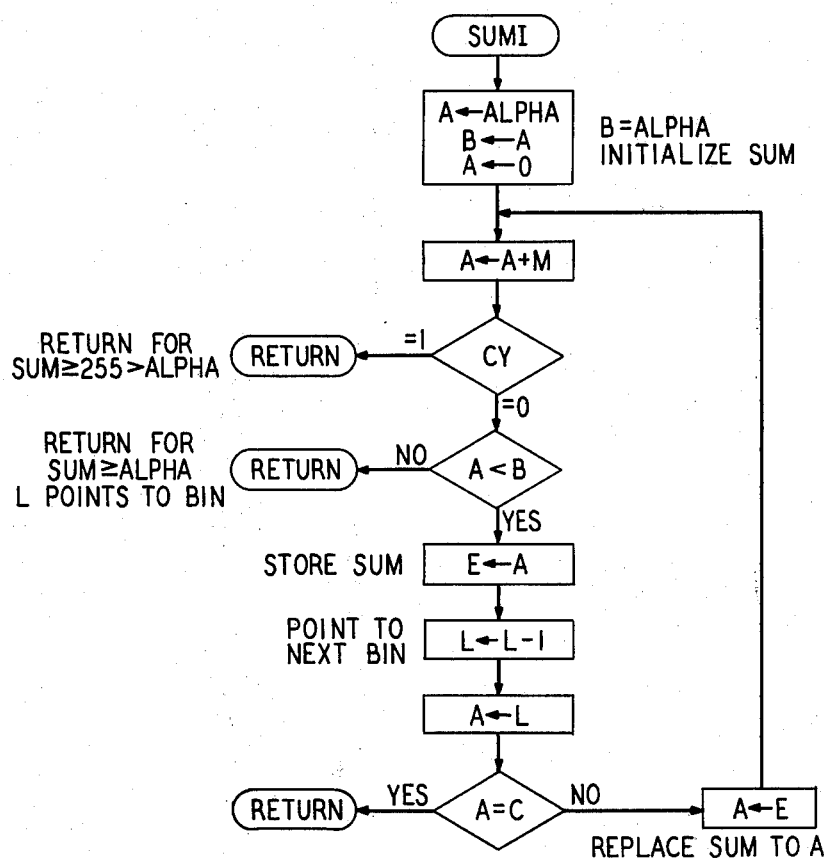

The subroutine for action 235 which, as previously described, analyzed the histograms is shown in FIG. 12. After the entry point ISOD of the subroutine, the microprocessor points to page and location of the last bin of the "early" histograms and enters a "0" count in register "C". The subroutine then proceeds to the action SUMI, which subroutine is shown in detail in FIG. 13.

The SUMI subroutine initially obtains the alpha number (50) which, as previously described, was initially stored in RAM 105 and registers this number (50) in the microprocessor. A "0" value is placed in the accumulator and the process proceeds to an action where the accumulator sums this value therein ("0") together with the value count in the histogram bin it is presently pointing to which, in this case, is the highest or last histogram bin. If this sum equals (or exceeds) 255 (indicating that for this initial calculation that the bin is saturated), the subroutine returns to subroutine ISOD. In the event, however, that the last histogram bin is not full, the sum does not equal or exceed 255, the carry flag is "0", and the process proceeds to the decision where, if the sum in the accumulator (which initially comprises the count in the last histogram bin) exceeds the alpha (50) value, the process returns to subroutine ISOD. Alternatively, if the sum in the accumulator does not exceed alpha, the process places the sum from the accumulator in register "E", points to the next highest bin and loads this location number into the accumulator. If this location number is "0" indicating that all bins (except the "0" bin) have been examined, the process returns to subroutine ISOD. In our case the microprocessor is pointing to the next to highest bin "98", and the subroutine replaces the sum stored in register "E" back in the accumulator and the process loops back to the action in the subroutine where the accumulator sums the value therein to the count in the histogram bin that the microprocessor is presently pointing at. This subroutine is again repeated in the same manner as previously described until a condition is met wherein the process returns to the subroutine ISOD.

Figure 16:
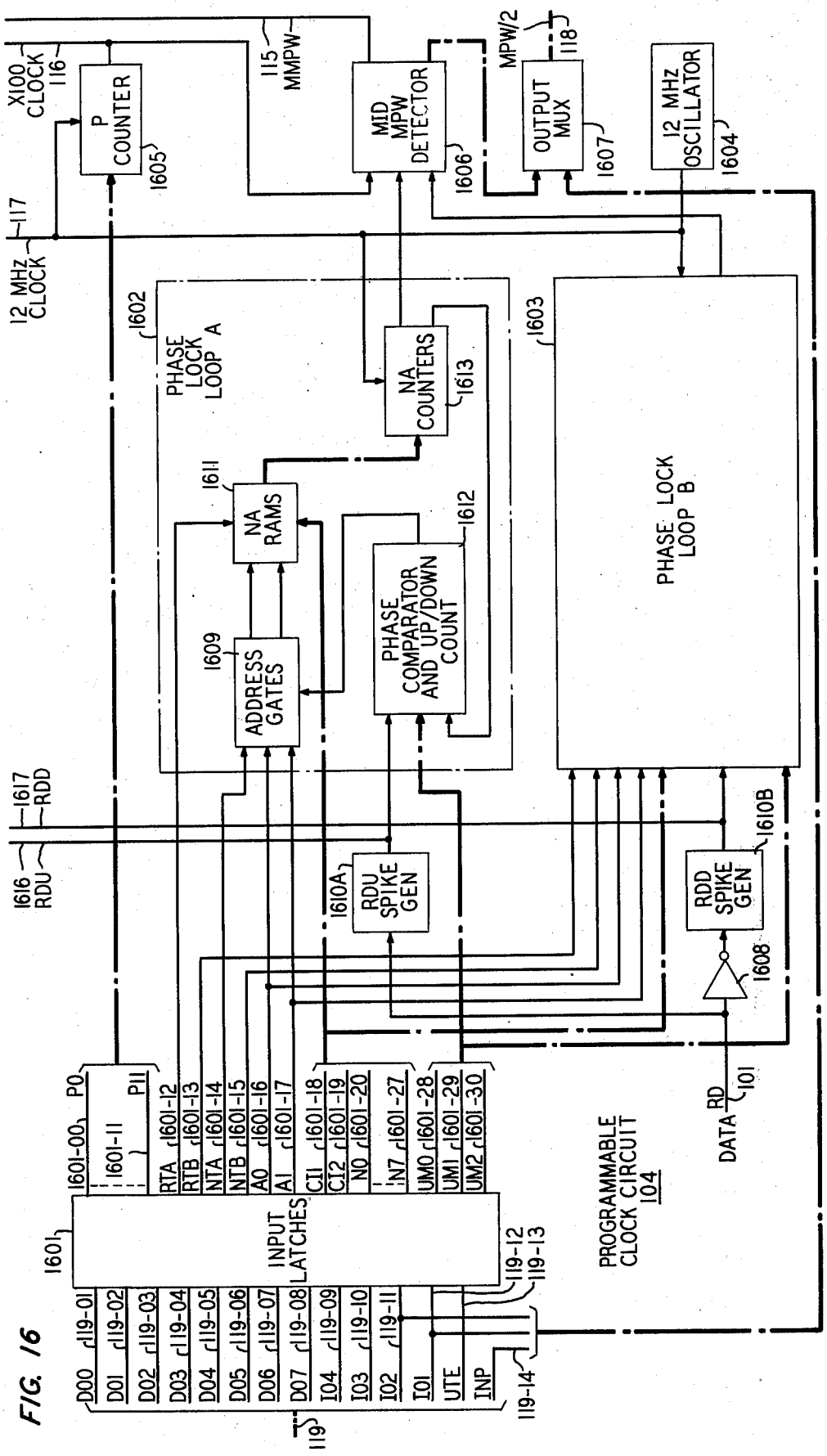

The several major components of programmable clock circuit 104 are shown in FIG. 16. As previously disclosed, programmable clock circuit 104 includes a clock recovery circuit which locks to the leading and trailing edges of the incoming data pulses on lead 101, generating, over a period of time, pulses corresponding to the median leading and trailing edges of the incoming data pulses to thereby produce a median pulse. The clock recovery circuit also finds the midpoint of the median pulse and generates a pulse aligned with this midpoint. In general, the components comprising the clock recovery circuit include phase lock loops 1602 and 1603 and a portion of MID MPW detector 1606.

Programmable clock circuit 104 also includes an internal clock which generates a 12 MHz clocking signal and further includes countdown circuitry for generating 100 clock pulses for each element of the incoming data signal. This internal clock circuitry generally comprises oscillator 1604 and counter 1605. Finally, programmable clock circuit 104 generates a binary number which defines one-half the length of the median pulse, which binary generator comprises a further portion of MID MPW detector 1606. The binary number is passed through output MUX 1607 to microcomputer 110 by way of multiple leads 118.

As previously indicated, programmable clock circuit 104 is controlled by control signals on multiple leads 119 to program the clock circuit to recover the clocking signal from the incoming data and produce the 100 times clock at a speed appropriate to the incoming data, which control signals are, as previously described, provided by microcomputer 110. As seen in FIG. 16, multiple leads 119 comprise leads 119-01 through 119-14. More specifically, leads 119-01 through 119-08 constitute signaling leads derived from Data bus 121 and leads 119-09 through 119-14 constitute control leads derived from Address bus 120. It is a principal function of the information on the Data bus leads to provide control information for programmable clock circuit 104, which information principally defines the speed of the incoming data. It is a principal function of control leads 119-09 through 119-12 to select specific ports of input latches 1601 and output MUX 1607 for purposes described in further detail hereinafter. Finally, it is a principal function of leads 119-13 and 119-14 to enable input latches 1601 and output MUX 1607, respectively.

Input latch 1601 accepts the data and control information on multiple leads 119 and in accordance with the control information applies the data information to appropriate portions of programmable clock circuit 104 by way of latch output leads 1601-00 through 1601-30. More specifically, when input latches 1601 are enabled by a control signal on lead 119-13, an appropriate latch therein is selected by input control leads 119-09 to 119-12 to store the information on Data bus leads 119-01 to 119-08 and pass the stored information to associated ones of output leads 1601-00 to 1601-30. The specific manner in which input latches 1601 provide the output signals in response to the input signals on multiple leads 119 is described hereinafter.

Oscillator 1604 is a source of square wave pulses, providing the pulses at an approximate 12 MHz rate. This 12 MHz clock signal is passed to lead 117 which, as previously described, is applied to individual distortion measurement circuit 102. The 12 MHz clock signal is also passed to phase lock loops 1602 and 1603 and to counter 1605.

Counter 1605 is programmed by the information on output leads 1601-00 through 1601-11 of latches 1601 to count down the 12 MHz clock to provide the 100 times clock at a rate appropriate to the rate of the incoming data. The output of counter 1605 is passed on lead 116 which extends to individual distortion measurement circuit 102. The 100 times clock signal on lead 116 is also passed to MID MPW detector 1606 for purposes described hereinafter.

The incoming data on lead 101 is applied to spike generator 1601A and by way of inverter 1608 to spike generator 1610B. Spike generator 1610A generates a spike aligned with the leading edge of the incoming data pulse. Since the input to spike generator 1610B has been inverted, spike generator 1610B generates a pulse aligned with the trailing edge of the incoming data pulse. The outputs of spike generators 1610A and 1610B are passed to phase lock loops 1602 and 1603, respectively, and are passed to individual distortion measurement circuit 102 by way of leads 1616 and 1617.

Phase lock loop 1602, as described hereinafter, will develop a pulse corresponding to the median leading edge of the incoming data pulses. Phase lock loop 1603, which is arranged in the same manner as phase lock loop 1602, will generate a pulse corresponding to the median trailing edge of the incoming data pulses. The pulses generated by phase lock loops 1602 and 1603 are applied to MID MPW detector 1606.

One function of MID MPW detector 1606 is to generate a binary number (that is, a binary count of the 100 times clock) corresponding to one-half the interval between the median leading edge pulse output of phase lock loop 1602 and the median trailing edge output of phase lock loop 1603. This one-half median pulse binary number is passed to output MUX 1607 which, under control of leads 119-11, 119-12 and 119-14, passes the binary number to mutiple leads 118 and back to microcomputer 110. In addition, MID MPW detector 1606 generates a pulse which is aligned with the middle of the median pulse, passing this mid-median pulse signal to lead 115.

Phase lock loop 1602 generally comprises address gates 1609, RAMS 1611, phase comparator 1612 and counters 1613. During the initialization portion of the process output leads 1601-14, 1601-16 and 1601-17 of latches 1601 enable and control address gates 1609 to apply appropriate address signals to RAMS 1611. At the same time particular ones of the RAMS are enabled by the information on leads 1601-18 and 1601-19. Write pulses on lead 1601-12 thereupon enter three numbers on leads 1601-20 through 1601-27 into the addressed locations of the enabled RAMS of RAMS 1611. These three numbers define a center output frequency, an upper output frequency and a lower output frequency for phase lock loop 1602, the center frequency corresponding to the approximate frequency of the incoming data on lead 101.

RAMS 1611, under control of the address signals from address gate 1609, the enabling signals on leads 1601-18 and 1601-19 and a read state on lead 1601-12 reads out a particular one of the numbers to counter 1613. Assume first that the number corresponding to the center frequency is being read out. This enables counter 1613 to cycle at this center frequency, applying a spike once per cycle to MID MPW detector 1606 and feeding a square wave at this center frequency to phase comparator 1612. At the same time the leading edge pulse output of spike generator 1610A is applied to another input of phase comparator 1612, as previously described. In addition, a binary number is passed from output leads 1601-28 through 1601-30 of latches 1601 to phase comparator 1612, which binary number defines the center count for the phase comparator.

In general, phase comparator 1612 is arranged to upcount when the pulse from spike generator 1610A leads the output of counter 1613 and to downcount when the pulse from spike generator 1610A lags the count of counter 1613. Phase comparator 1612 will upcount and/or downcount until the net count reaches a maximum or minimum count whereupon address gates 1609 address RAMS 1611 at the location of the binary number defining the upper or lower output frequency. The frequency of counter 1613 is thereupon adjusted, for one cycle, changing the phase of the output thereof and a new phase comparison is initiated. Accordingly, phase lock loop 1602 will eventually align itself with the median of the leading edges of the incoming data pulses, providing pulses corresponding to these leading edges to detector 1606.

Phase lock loop 1603 operates in substantially the same manner, being controlled by the write or read state on lead 1601-13 and the enabling signals on lead 1601-15 to similarly generate a pulse corresponding to the median of the trailing edges of the incoming data pulses. This median trailing edge pulse together with the median leading edge pulse from phase lock loop 1602 define a median data pulse. The outputs of the phase lock loops are passed to MID MPW detector 1606.

The several major components of individual distortion measurement circuit 102 are shown in FIG. 15. In general, the circuit includes first detector 1501, counters 1502 and 1503, gates 1504, inhibit circuits 1505 and 1506, write generator 1508, increment generator 1509 and lockout generator 1510.

First detector 1501 recognizes the "first" spike or pulse corresponding to the leading edge of each data pulse on lead 1616 ignoring any transitions immediately thereafter due to noise. More specifically, the leading edge of the data pulse on lead 1616 is recognized by first detector 1501 to enable counter 1502 and subsequent transitions or pulses are ignored until the mid-median pulse is received on lead 115.

With counter 1502 enables, it proceeds to count the 100 times clock on lead 116. This count is then terminates by the mid-median pulse directly applied to counter 1502 from lead 115 whereby counter 1502 provides a final count defining the interval from the leading edge of the data pulse to the middle of the median pulse, which count was previously defined as the T1 count. The output numbers provided by counter 1502 are passed by way of multiple leads 1512 to gate 1504 together with a flag bit that designates this as the T1 count.

At the same time, counter 1503 is similarly enabled by the output of first detector 1501 to count the 100 times clock on lead 116. The count of counter 1503, however, is terminated by the pulse corresponding to the trailing edge pulse on lead 1617 whereby the counter advances to a final count defining the entire width of the data pulse, which count was previously defined as the T2 count. The output numbers of counter 1503 are applied by multiple leads 1513 to gates 1504 together with a flag bit designating this count as the T2 count.

When counter 1502 receives the mid-median pulse, it provides a write request signal by way of lead 1514 to inhibit circuit 1505. Inhibit circuit 1505, in turn, generates a write signal which is applied to gates 1504 and which is additionally applied through NOR gate 1507 to write generator 1508. Gates 1504, in response to the write signal, extend the T1 count on leads 1512 to multiple leads 112 which, as previously described, extend to microcomputer 110. At the same time, write generator 1508 generates the write pulse which is applied to lead 113, which pulse is previously described, enables the writing of the T1 number into RAM 105. In addition, the write pulse on lead 113 is passed to increment generator 1509 and lockout generator 1510.

Lockout generator 1510, in response to the write pulse, disables inhibit circuit 1505 and inhibit circuit 1506 to preclude generation of a new write signal immediately following the previously described write signal. The application of the write pulse to increment generator 1509 results in the generation of the increment pulse which is applied to lead 114, which pulse, as previously described, increments the address being applied to RAM 105. The increment pulse also terminates the operation of lockout generator 1510 whereby inhibit circuits 1505 and 1506 are again enabled to respond to write request signals. It is noted, as described in detail hereinafter, that inhibit circuit 1505 also includes memory which, in the event that a write request signal had been applied thereto, enables the inhibit circuit to generate the write signal after the lockout is removed.

When the pulse corresponding to the trailing edge on lead 116 terminates the count of counter 1503, the counter passes a write request signal by way of lead 1515 to inhibit circuit 1506. Inhibit circuit 1506 is arranged in substantially the same manner as inhibit circuit 1505 and generates a write signal in response to the write request signal. This write signal is applied to gates 1504 to extend the output T2 number on multiple leads 112. The write signal is also passed through NOR gate 1507 to write generator 1508 whereby the write pulse and the increment pulse are successively generated as previously described.

Figure 17:
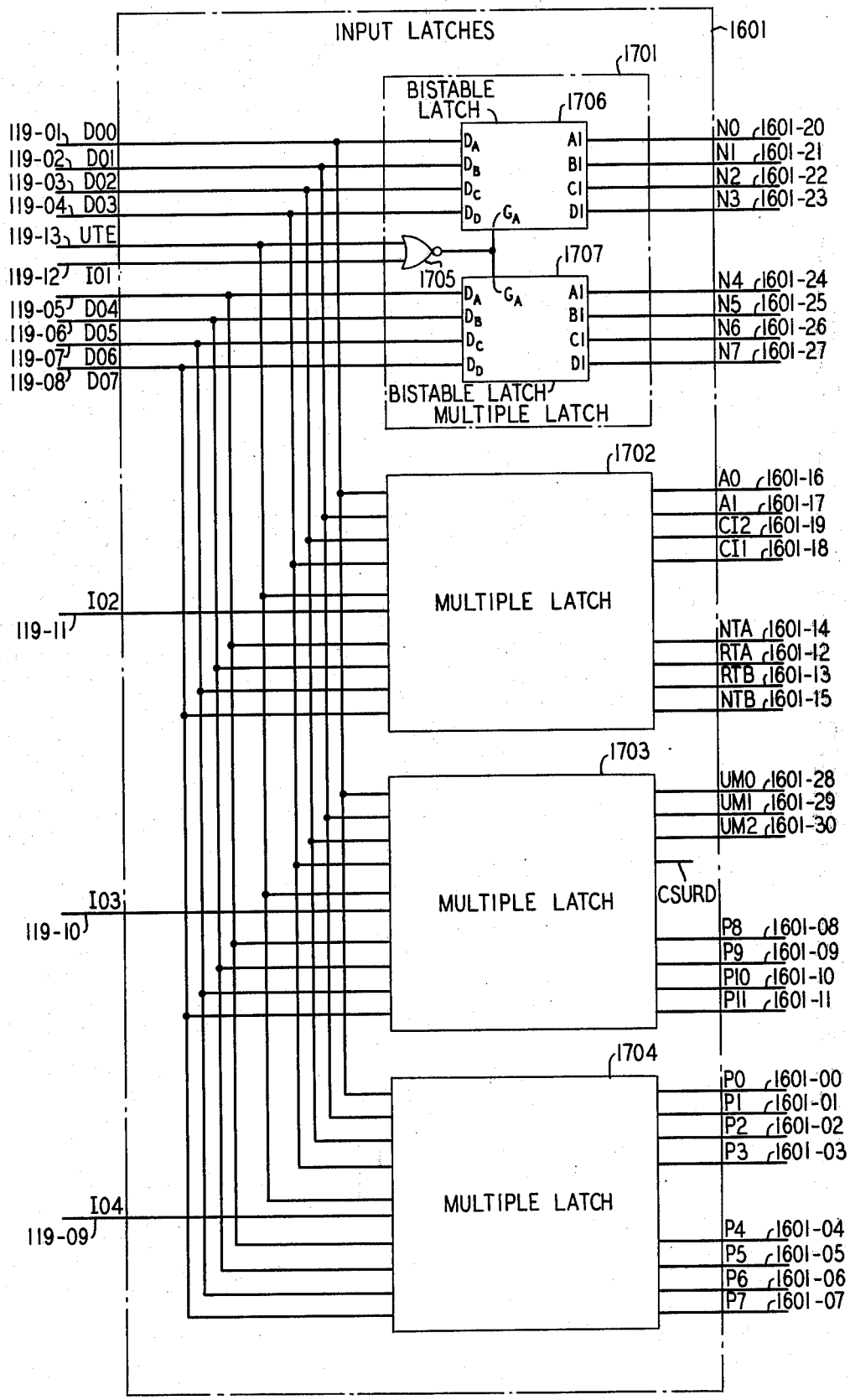
FIGS. 17 through 34 depict in schematic form the details of the several components of the distortion measuring circuit and the clock circuit.

The details of input latches 1601 are shown in FIG. 17. In general, FIG. 17 comprises multiple latches 1701–1704, each multiple latch being arranged in substantially the same manner. Multiple latch 1701, for example, comprises NOR gate 1705 and 4-bit bistable latches 1706 and 1707. When appropriate signals are applied to enabling lead 119-13 and to selecting lead 119-112, gate 1705 is enabled, passing, in turn, an enabling signal to 4-bit bistable latches 1706 and 1707. The binary number information on leads 119-01 through 119-04 is thereby gated into bistable latch 1706 and the binary number information on leads 119-05 through 119-08 is gated into binary latch 1707. Each latch, in turn, retains the number applied thereto and passes the retained number to its out terminals thereby applying the information to output leads N0 through N7. These output numbers are retained on the output leads after the disabling of NOR gate 1705 and until new numbers are gated into the latches.

Figure 18:
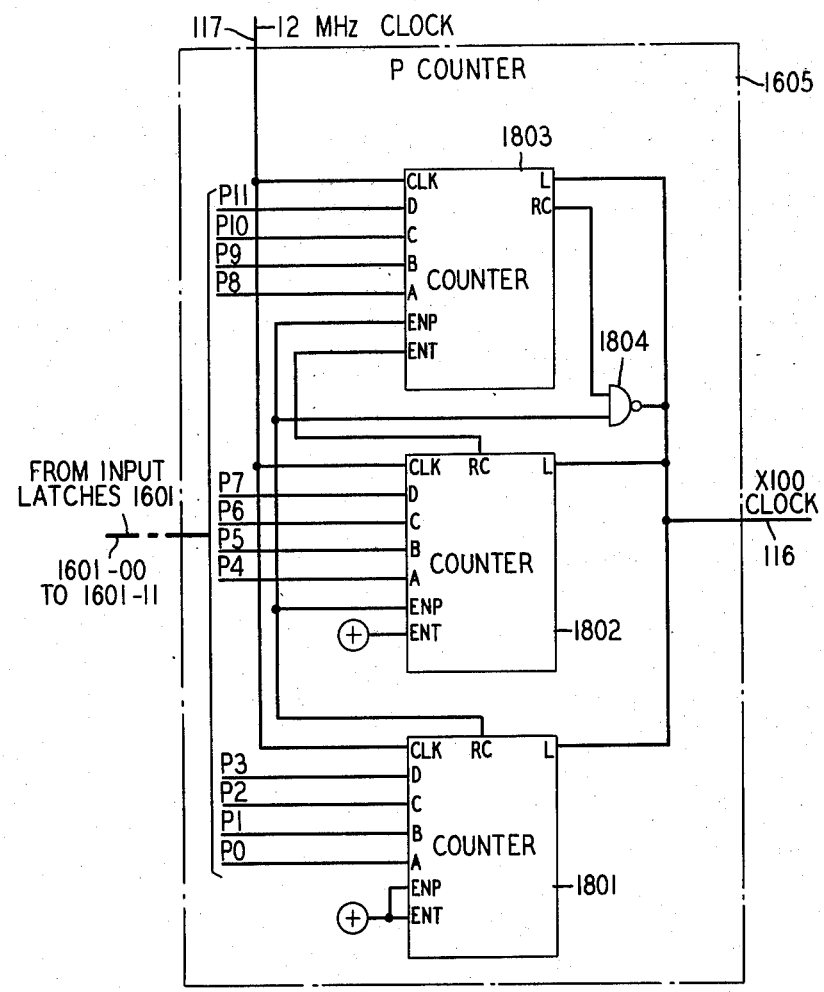

The details of counter 1605 are shown in FIG. 18. The counter comprises 4-bit binary counters 1801–1803 and NAND gate 1804. Each of counters 1801–1804 is a 4-bit binary counter. Each of counters 1801–1803 is enabled, in response to high potentials applied to both input terminals ENP and ENT, to advance in response to 12 MHz clock pulses applied via lead 117 to input terminal CLK and to pass a high potential pulse through output terminal RC when the maximum count is achieved. The counter is loaded to an initial count by the number applied to input terminals A–D, which number is loaded into the counter when a negative pulse loading signal is passed to input terminal L.

The RC terminal outputs of counters 1801 and 1803 are connected to NAND gate 1804 enabling the NAND gate when a maximum count for all counters is achieved. The resultant pulse output of NAND gate 1804 is passed to output lead 116 and constitutes the 100 times clock signal. The pulse output of NAND gate 1804 is also passed to the L input terminal of counters 1801–1803 to provide the loading signal. The numbers loaded into the counters comprise the output numbers on leads 1601-00 through 1601-11 of input latches 1601.

Assume now that the numbers have just been loaded into counters 1801–1803. Counter 1801, being normally enabled by high potentials on input terminals ENP and ENT, proceeds to count starting from an initial count defined by the number loaded therein and under control of the 12 MHz clock. When its maximum count is achieved, it enables the ENP input terminal of counters 1802 and 1803. Since the ENT terminal of counter 1802 is normally enabled, the next clock pulse increments counter 1802 one count from the number previously loaded therein and at the same time recycles counter 1801 back to the count of zero. Counter 1801 thereupon continues to recycle advancing counter 1802 once per cycle until the counts of both counters reach a maximum, enabling input terminals ENP and ENT of counter 1803. The next clock pulse thereupon increments counter 1803 one count from the number initially loaded therein and recycles counters 1801 and 1802. This process is continued until the maximum count for all counters is achieved to enable NAND gate 1804, providing the 100 times pulse on lead 116 and reloading the counters.

Figure 21:
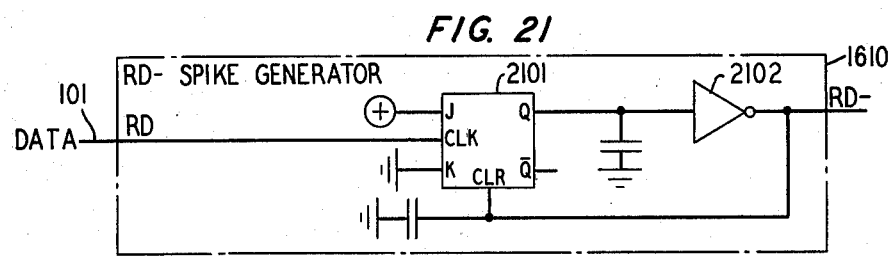

The specific circuitry for spike generator 1610A or 1610B is shown in FIG. 21. The incoming data (or the inversion thereof) is applied to the clock input of flip-flop 2101 in the spike generator. Since the J input of the flip-flop is tied to a high potential, the leading edge of the pulse therefore sets the flip-flop. The spike generator 1610A flip-flop is therefore set by the leading edge of the data pulse and the spike generator 1610B flip-flop (which receives the inverted data) is therefore set by the trailing edge of the data pulse. When set, the output of flip-flop 2101 goes high and is inverted by inverter 2102. This negative potential is applied back, after a delay, to the clear input of the flip-flop, resetting the flip-flop to the clear state. The output of inverter 2102 is also passed to the output lead of the spike generator (which would constitute either lead 1616 or 1617) and comprises a negative spike aligned with the leading edge or the trailing edge of the data pulse.

Figure 22:
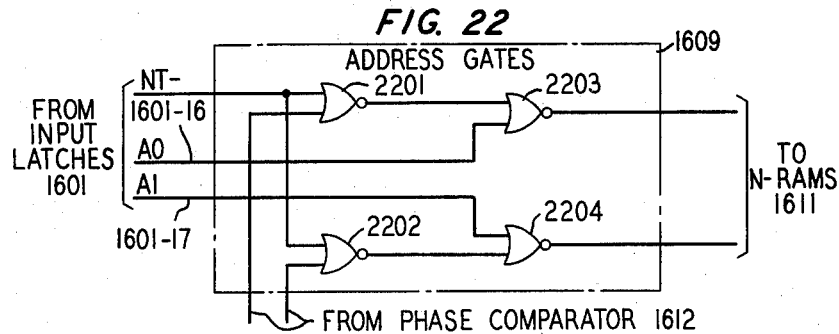

The details of the address gates such as address gates 1609 are shown in FIG. 22. During the initializing part of the process a high potential is provided to output lead NTA or NTB of input latches 1601, which lead would constitute either lead 1601-14 or 1601-15. This enabling potential drives the output of NOR gates 2201 and 2202 low. NOR gates 2203 and 2204 are therefore enabled to pass, inverted, the data on leads 1601-16 and 1601-17 to the RAMS, such as RAMS 1611. During portions of the process other than the initializing portions, leads 1601-14 or 1601-15 is low and leads 1601-16 and 1601-17 are low. NOR gates 2201–2204 are thereby enabled to pass the outputs of phase comparator 1612 therethrough to RAMS 1611.

Figure 20:
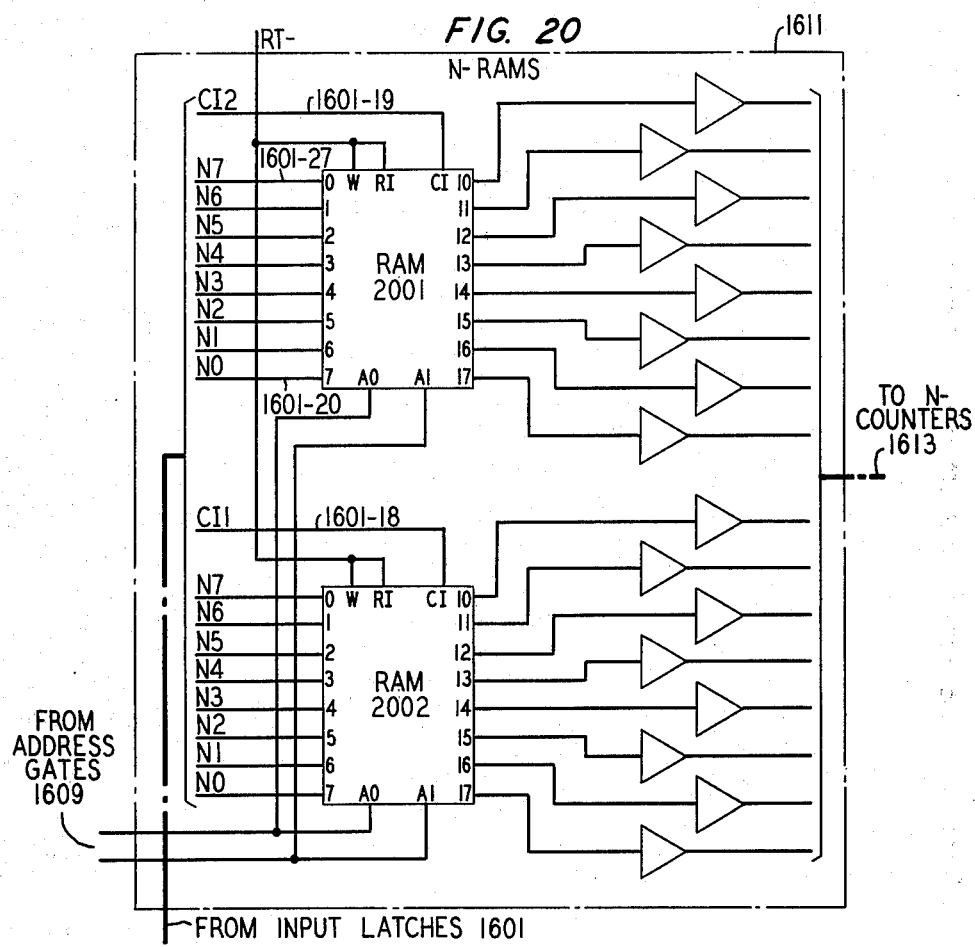

The details of the phase lock loop RAMS, such as RAMS 1611, are shown in FIG. 20. RAMS 1611 generally comprise RAM 2001 and RAM 2002. Each RAM is enabled by a high condition write signal derived from lead 1601-12 (or 1601-13) and applied to input terminals W and RI, provided that a high potential inhibiting signal is not concurrently applied to input terminal CI, to write into the RAM the number applied to input terminal 0–7 at the address designated by the number applied to input terminals A0 and A1. Each RAM is also arranged when a low potential is applied to input terminals W and RI, provided that a high inhibiting potential is not concurrently applied to input terminal CI, to read out through terminals 10–17 the number stored in the address location designated by the number applied to input terminals A0 and A1. Accordingly, with respect to RAM 2001, when a high potential is applied to lead RT-, which may constitute lead 1601-12 or 1601-13 from input latches 1601, and a low potential is applied to lead 1601-19, the number applied by input latches 1601 to leads 1601-20 through 1601-27 is read into the RAM location designated by the outputs of address gates 1609. When a low potential is applied by input latches 1601 to a write lead such as write lead 1601-12 together with a low potential to lead 1601-19, RAM 2001 reads out through terminals 10–17 the number stored in the address location designated by the outputs of address gates 1609, which number thereby passes to counters 1613.

Figure 23:
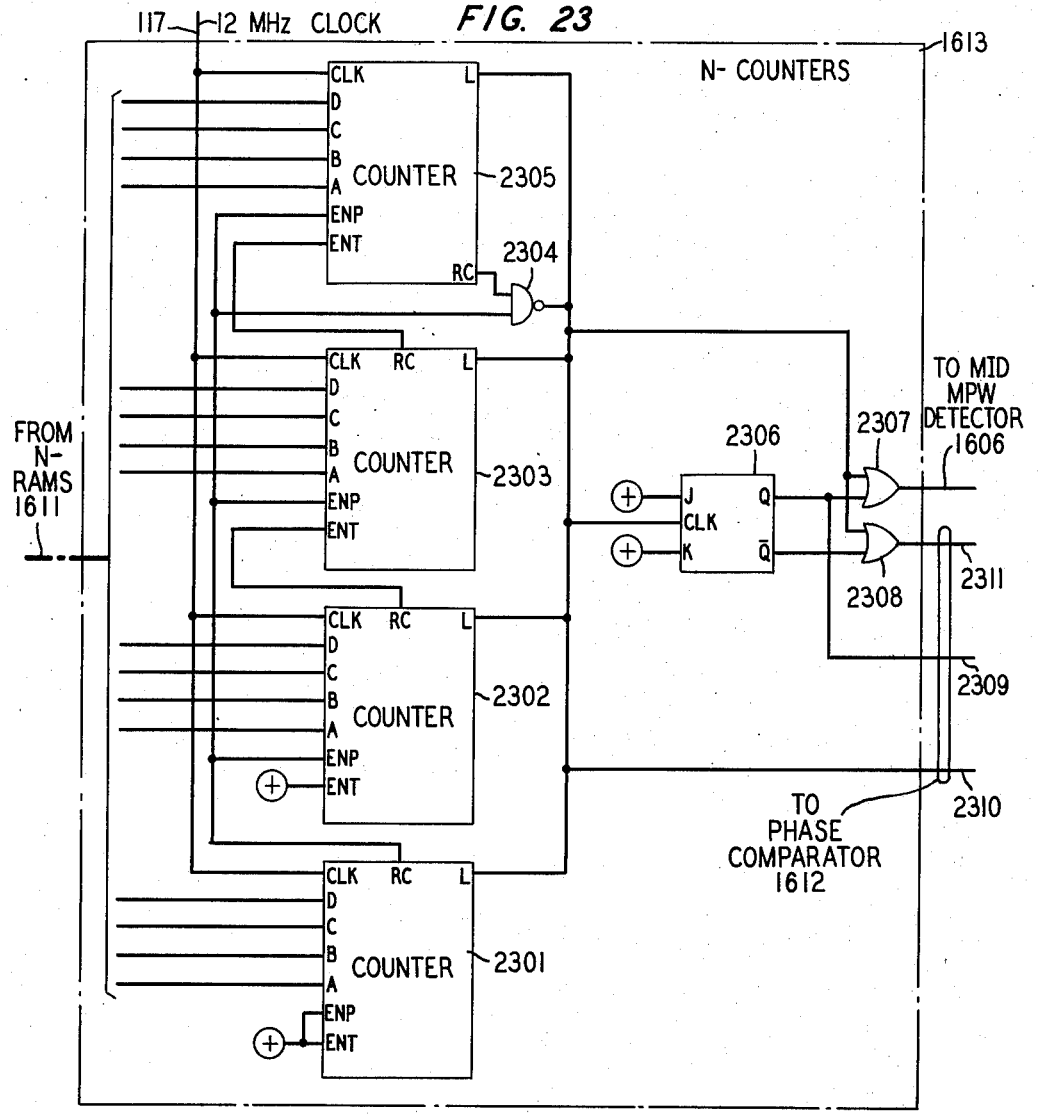

The details of the N counters for the phase lock loops such as N counters 1613 are shown in FIG. 23. N counters 1613 include 4-bit binary counters 2301, 2302, 2303 and 2305 together with NAND gate 2304. These counters are arranged in substantially the same way as the counters in counters 1605 with the exception that counters 1613 includes a fourth 4-bit binary counter. Accordingly, noting that the output of RAMS 1611 applies predetermined loading numbers to counters 2301, 2302, 2303 and 2305, the output of NAND gate 2304 provides a negative pulse each time all the counters are advanced by the 12 MHz clock to achieve a maximum count and each negative pulse loads counters 2301 through 2303 and 2305 to initiate a new count.

The loading numbers are selected by the previously described microcomputer process to provide a negative pulse train having twice the rate of the incoming data pulses, alternate ones of the negative pulses being generated to be aligned with the leading (or trailing) edges of the data pulses, as described hereinafter.

The negative pulses are passed to output lead 2310, to OR gates 2307 and 2308 and to the clock input of flip-flop 2306. Flip-flop 2306 is thereby clocked to alternate states in response to the output pulses of NAND gate 2304 and provides a square wave having the same rate as the data pulse rate. The Q output of flip-flop 2306 is passed to output lead 2309 and to the other input of OR gate 2307. Accordingly, the output of OR gate 2307 goes negative when the NAND gate 2304 output provides its negative pulse and the Q output of flip-flop 2306 is still negative, which conditions concurrently occur at the leading edge of the Q output of flip-flop 2306 and therefore at the leading edge of the median pulse which corresponds to the median leading (or trailing) edges of the data pulses. This leading edge median pulse output of OR gate 2307 is passed to MID MPW detector 1606. At the same time, the inverted output provided at output terminal $\overline{Q}$ of flip-flop 2306 is applied to OR gate 2308. As a consequence, the output of OR gate 2308 is the alternate negative pulse output of NAND gate 2304, which alternate negative pulse is passed to lead 2311. Leads 2309, 2310 and 2311 are applied to the phase comparator, such as phase comparator 1612.

Figure 24:
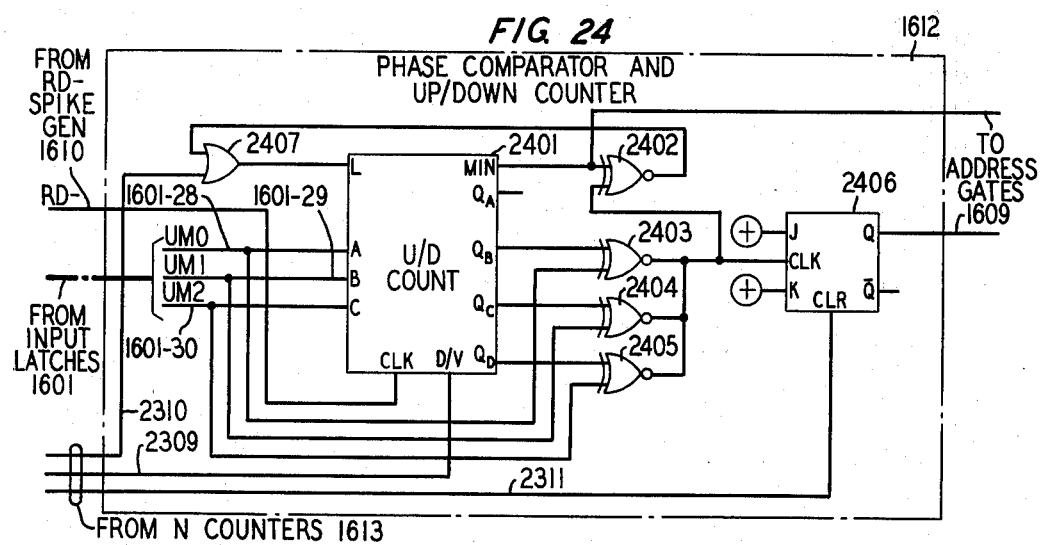

The details of the phase lock loop phase comparator, such as phase comparator 1612, are shown in FIG. 24. Phase comparator 1612 includes up/down counter 2401 which is clocked by the pulse output of spike generator 1610A to count up or down in accordance with the potential on input lead D/U, which potential is derived from output lead 2309 of N counters 1613. Up/down counter 2401 is initially loaded in response to a negative pulse on input terminal L which loads therein a number provided to input terminals A, B and C. The counter comprises a 4-bit binary counter wherein the three most significant bit outputs are derived from output terminals QB, QC and QD. When the counter downcounts to zero, a positive signal is provided to output terminal MIN. The number which is to be loaded into counter 2401 is provided on leads 1601-28 through 1601-30 from input latches 1601 and, as previously described, this number corresponds to the center of the count necessary to provide an output.

Assume now that the number on leads 1601-28 to 1601-30 has been loaded in up/down counter 2401. The counter proceeds to count, up or down, from the loaded number in accordance with the potential of the square wave applied by counter 1613 to lead 2309. Normally, assuming that the phase lock loop is substantially aligned with the incoming data pulses, the output of counters 1613 on lead 2309 is substantially aligned with the leading (or trailing) edge of the incoming data pulse, and up/down counter 2401 will randomly count up and down about the loaded number. In the event, however, that the data continuously lags the output of the N counters 1613, the leading (or trailing) edge pulse derived from spike generator 1610 will generally occur during the initial positive portion of the square wave on lead 2309 and up/down counter 2401 will generally decrement toward the count of "0". When the count of "0" is achieved, a positive pulse is provided through output terminal MIN and passed on through the output of phase comparator 1612 to address gates 1609. The output of terminal MIN is also applied to exclusive NOR gate 2402, whose other input is normally low as described hereinafter. The output of exclusive NOR gate 2402 is normally high until driven low in response to the high output of output terminal MIN. The normally high output of exclusive NOR gate 2402 normally disables OR gate 2407. When output terminal MIN provides the high potential to exclusive NOR gate 2402, OR gate 2407 is enabled passing the negative pulse from output lead 2310 of counters 1613 to input terminal L whereby the number on leads 1601-28 through 1601-30 is reloaded into up/down counter 2401.

Assume now that the input data leads the output of counters 1613. The pulse from spike generator 1610 therefore clocks counter 2401 when the terminal negative portion of the square wave on lead 2309 is applied to input terminal D/U. Up/down counter 2401 is therefore generally incremented by the spike from spike generator 1610 until a binary count is reached which is twice the value of the loaded number. At this point, it is to be appreciated that the three bits of a number is the same as the three next most significant bits of the number which is twice the value. Accordingly, when up/down counter 2401 increments to twice the number that is the loaded number, the two inputs to each of exclusive NOR gates 2403-2405 are the same. Thus, the outputs of all of exclusive NOR gates 2403-2405 go high when the number in up/down counter 2401 is twice the loaded number and flip-flop 2406 is clocked to the set state. The Q output of the flip-flop is passed to address gate 1609. At the same time, the high outputs of exclusive NOR gates 2403-2405 are passed to exclusive NOR gate 2402 and the output of gate 2402 goes low to reload the loading number back into up/down counter 2401 in the same manner as previously described. The negative pulse on lead 2311 of N counter 1613 clears flip-flop 2406.

Figure 25:
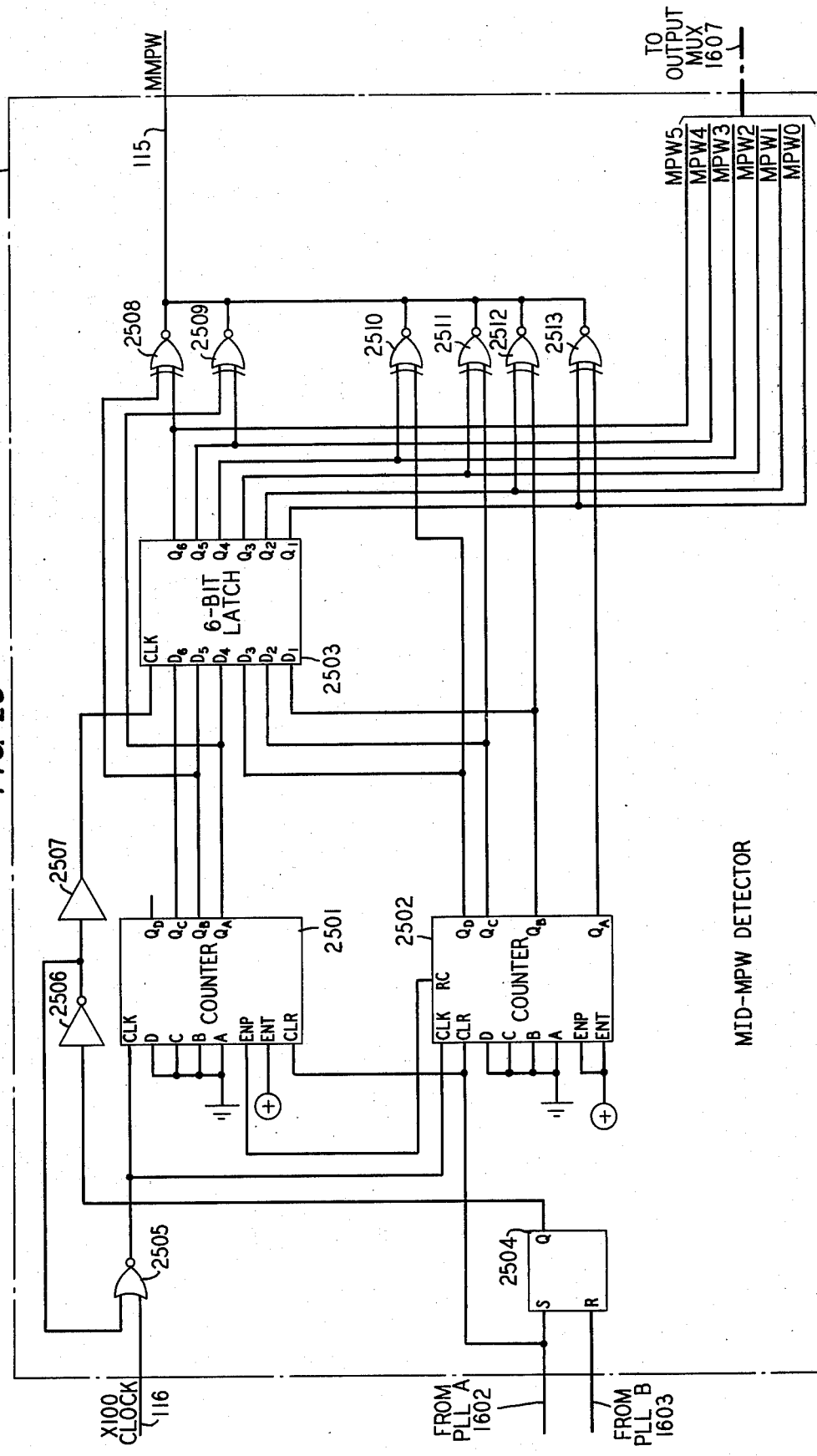

MID MPW detector 1606 is shown in detail in FIG. 25. The principal components of the detector are counters 2501 and 2502 and 6-bit latch 2503. When the median leading edge pulse is obtained from phase lock loop 1602, it is applied to the set input of flip-flop 2504 and the clear inputs of counters 2501 and 2502. Flip-flop 2504 is thereupon set and the counters are cleared and restored to the count of "0". The high potential at the Q output of flip-flop 2504 is passed through inverter 2506 to enable NOR gate 2505. The 100 times clock pulses on lead 116 are thereupon passed through NOR gate 2505 to the CLK inputs of counters 2501 and 2502. The ENP and ENT input terminals of counter 2502 are permanently enabled permitting counter 2502 to start incrementing from the count of "0". When the counter achieves its maximum count, it applies an enabling potential to the ENP terminal of counter 2501. Since the ENT input terminal of counter 2501 normally has a high potential applied thereto, the input clock pulse through NOR gate 2505 increments counter 2501 from an initial count of "0" and at the same time recycles counter 2502 back to its initial count. The two counters will repeat this process advancing the count therein until the median trailing edge pulse is received from phase lock loop 1603. This resets flip-flop 2504, disabling NOR gate 2505 to terminate the incrementing of counters 2501 and 2502. The low potential on the Q output of flip-flop 2504, inverted, is also passed to the CLK input of 6-bit latch 2503, which thereupon stores the three most significant bit outputs of counter 2502 and the three least significant bit outputs of counter 2501. Since this count, which is stored into 6-bit latch 2503, is initiated by the median trailing edge pulse and is terminated by the median trailing edge pulse, and further since the least significant bit of the count has been eliminated, the resultant count in latch 2503 defines one-half of the median pulse duration. This count defining one-half the median pulse is provided to output terminals Q1-Q6 of 6-bit latch 2503 and passed to output multiplexer 1607 and at the same time passed to exclusive NOR gates 2508-2513.

This process is again repeated when the next median leading edge pulse is received from phase lock loop 1602. When counters 2501 and 2502 count up to the count defining one-half the median pulse, this number is passed from output terminals QA-QD of counter 2502 and output terminals QA and QB of counter 2501 to exclusive NOR gates 2508-2513 and will match the output number of 6-bit latch 2503. The outputs of exclusive NOR gates 2508-2513 therefore go high at the midpoint of the median pulse, providing a positive pulse at this time to MMPW lead 115.

Figure 19:
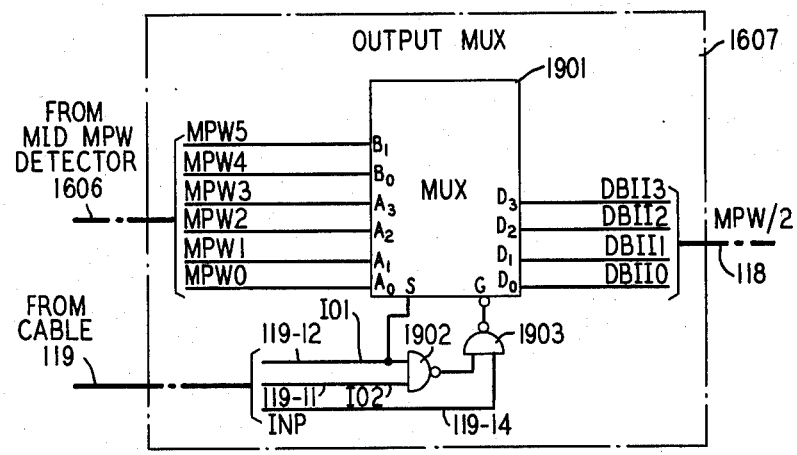

The details of output multiplexer 1607 are shown in FIG. 19. Output multiplexer 1607 includes multiplexer 1901 which is enabled by a low potential on input terminal G to alternatively gate the number on input terminals A0-A3 and B0-B1 to output terminals D0-D3 in accordance with the potential applied to input terminal S. The input terminals A0 to A3 and B0 to B1 of multiplexer 1901 are connected to the outputs of MID MPW detector 1606. The output terminals D0-D3 are connected to multiple leads 118 which carries the MPW/2 binary number to microcomputer 110. When input lead 119-11 from microcomputer 110 is low, the output of NAND gate 1902 is high. If input lead 119-14 is concurrently high, NAND gate 1903 is enabled, enabling, in turn, multiplexer 1901. The potential on lead 119-12, which extends to input terminal S, thereupon selects the groups of input terminals, whereby the potentials thereon are passed to lead 118. The number provided by MID MPW detector 1606 is thereby passed on to microcomputer 110.

Figure 31:
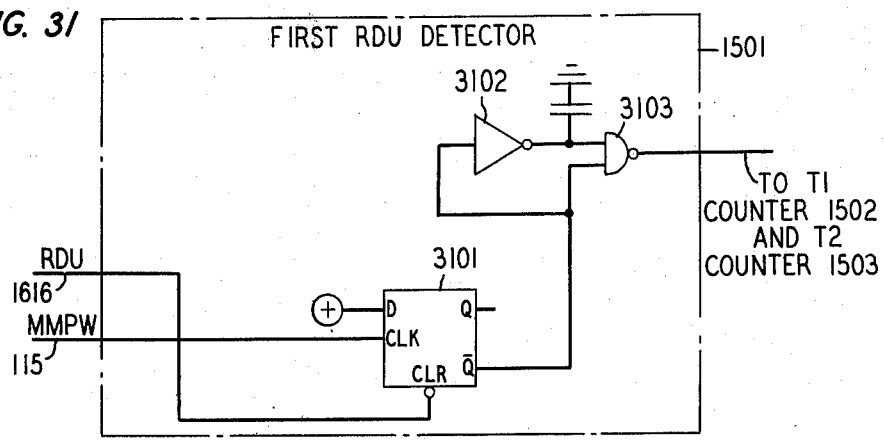

The details of the first detector circuit 1501 of individual distortion measurement circuit 102 is shown in FIG. 31. Initially, flip-flop 3101 is in the set condition, thereby applying a low condition to disable NAND gate 3103. It is noted that this low condition, inverted by inverter 3102, applies a high condition to the other input of the NAND gate. The disabled NAND gate at this time applies a high condition to its output which extends to T1 counter 1502 and T2 counter 1503. When the leading edge pulse from spike generator 1610A appears on lead 1616, flip-flop 3101 is cleared. A high potential on the $\bar{Q}$ lead now enables NAND gate 3103. After a delay, the inversion of the output of flip-flop 3103 is applied by inverter 3102 to the other input of NAND gate 3103 whereby the NAND gate is momentarily enabled and then disabled. A negative spike is therefore delivered to T1 counter 1502 and T2 counter 1503. At this time flip-flop 3101 is still in the set condition rendering it unresponsive to further pulses on lead 1616. When the pulse at the midpoint of the median pulse is received, however, on lead 115, flip-flop 3101 is clocked back to the set state enabling it again to recognize the next leading edge pulse.

Figure 26:
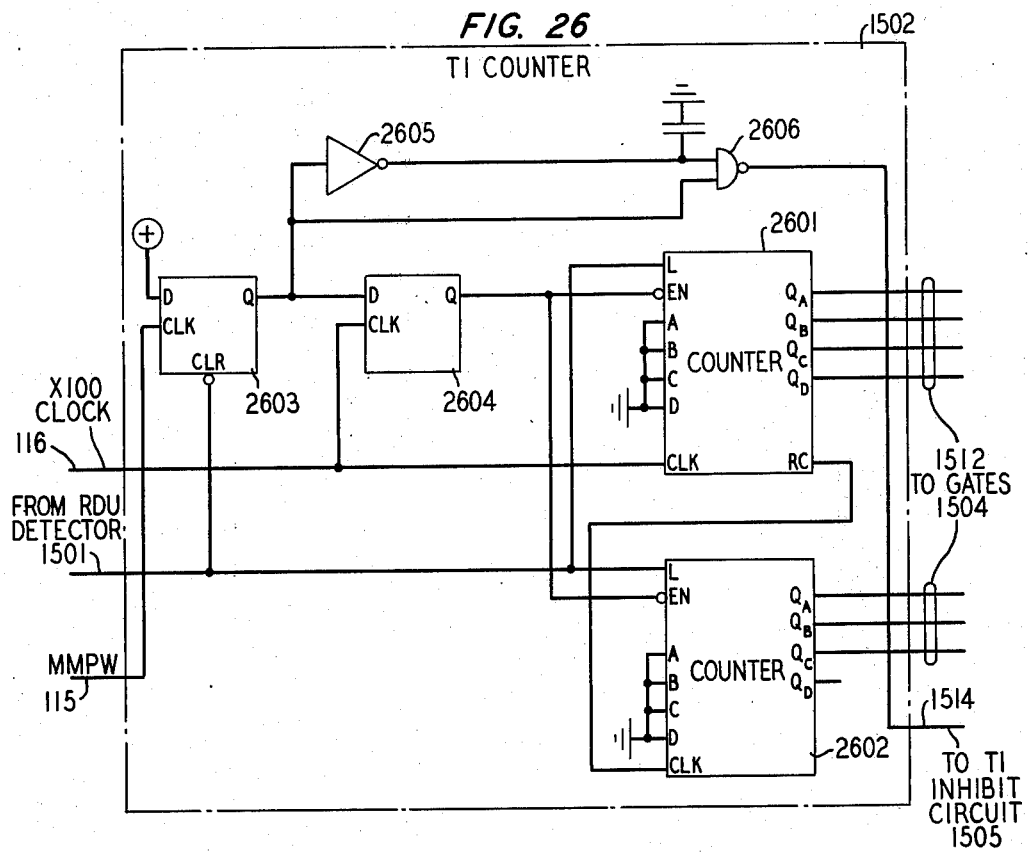

The details of T1 counter 1502 are shown in FIG. 26. The spike pulse from RDU detector 1501, when applied to T1 counter 1502, clears flip-flop 2603 and loads a zero count through terminals A, B, C and D of counters 2601 and 2602 into the two counters. The clearing of flip-flop 2603 provides a low output which holds NAND gate 2606 disabled and which is also applied to the D input of flip-flop 2604. A high input is also applied to the other input of NAND gate 2606 by the output of flip-flop 2603, inverted by inverter 2605. The 100 times clock pulse on lead 116 immediately following the pulse spike from RDU detector 1501 now clocks flip-flop 2604 to the clear condition and the low output of the flip-flop enables counters 2601 and 2602 to be advanced. Thus, counter 2601 is incremented by each of the 100 times clock pulses on lead 116 and counter 2602 is incremented each time counter 2601 reaches its maximum count. When the mid-median pulse signal is received on lead 115, flip-flop 2603 is clocked to the set condition. A high potential is thus applied to the D input terminal of flip-flop 2604 and to the input of NAND gate 2606. The next 100 times clock pulse clocks flip-flop 2604 to the set condition, disabling counters 2601 and 2602, rendering them unresponsive to the 100 times clock pulses. The count from the leading edge of the data pulse to the middle of the median pulse (which count is defined as the T1 count) is therefore available on the output terminals (QA-QD and QA-QC) of counters 2601 and 2602, respectively. This T1 count is provided by the output terminals through multiple leads 1512 to gates 1504. In addition, the high condition applied to NAND gate 2606 enables the NAND gate. The inversion of the high condition provided by inverter 2505 is passed to NAND gate 2606 after a delay, again disabling NAND gate 2606. The NAND gate thereby provides a negative pulse spike through lead 1514 to T1 inhibit circuit 1505, and constitutes the write request signal.

Figure 27:
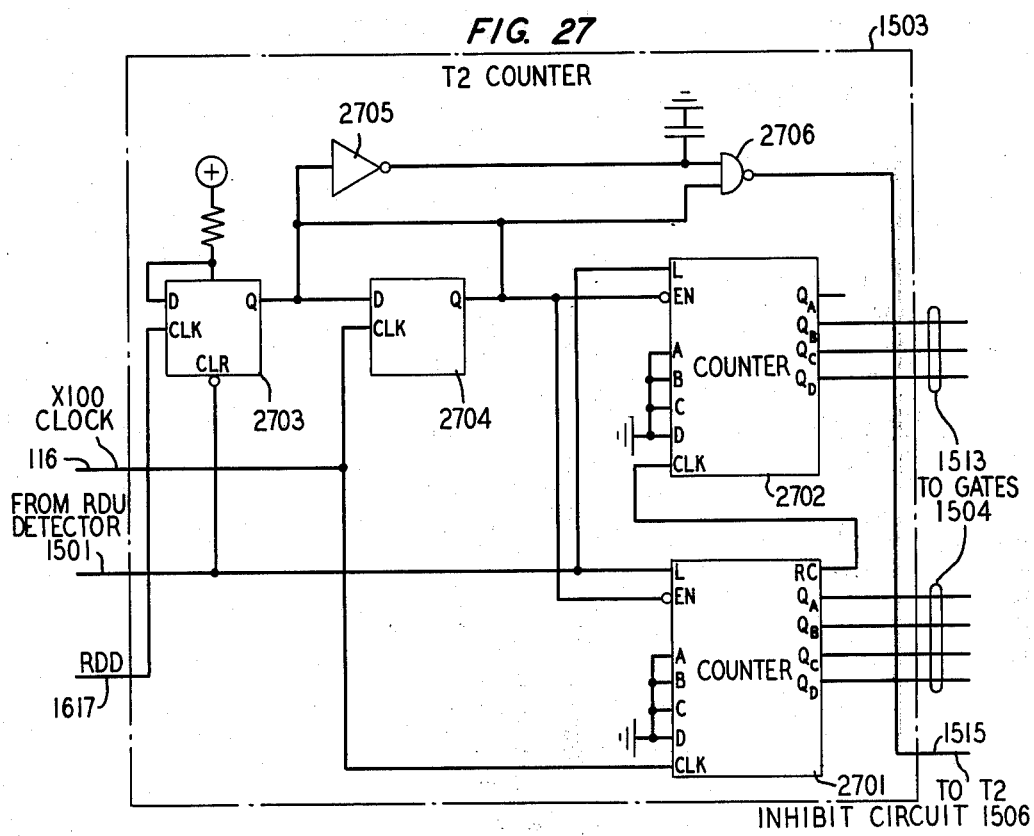

The details of T2 counter 1503 are shown in FIG. 27. As can be seen in FIG. 27, T2 counter 1503 is arranged in the same manner as T1 counter 1502 with the exception that leads 1617 which carries the trailing edge pulse clocks flip-flop 2703, whereas, in T1 counter 1502, the mid-median pulse on lead 115 clocks corresponding flip-flop 2603. As a result, T2 counter 1503 provides the T2 count which defines the interval between the leading edge spike from RDU detector 1501 and the trailing edge pulse on lead 1617.

Figure 28:
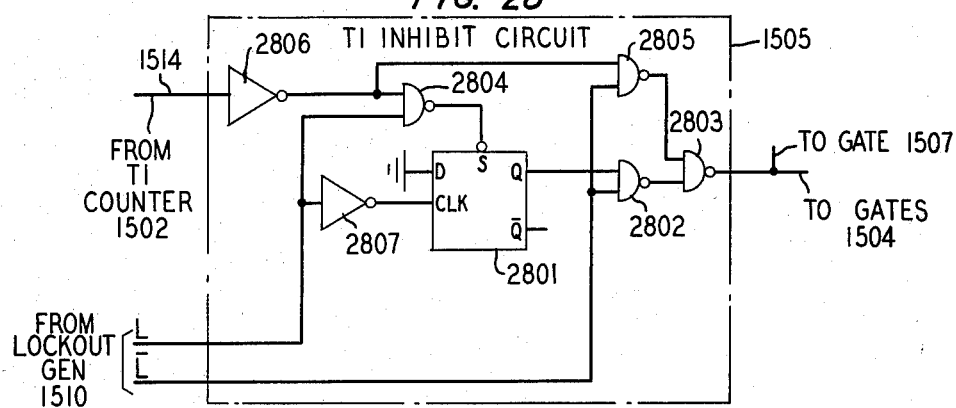

The details of T1 inhibit circuit 1505 are shown in FIG. 28. In the normal condition flip-flop 2801 is in the clear condition. This disables NAND gate 2802 which, in turn, partially enables NAND gate 2803. Assuming that lock-out generator 1510 is not in the lock-out mode, a low potential is applied to lead L and a high potential to lead $\overline{L}$ as described hereinafter. The low potential on lead L disables NAND gate 2804. At the same time the high potential on lead $\overline{L}$ partially enables NAND gate 2805. T1 counter 1502 is normally providing a high potential through lead 1514 to inverter 2806. The consequent low potential disables NAND gate 2805 which together with NAND gate 2802 enables NAND gate 2803. A low potential is thereby provided to the output of T1 inhibit circuit 1505.

Assume now that a momentary write request signal pulse is received from T1 counter 1502 on lead 1514. Inverter 2806 inverts this negative pulse to momentarily enable NAND gate 2805. This, in turn, momentarily disables NAND gate 2803 and this latter NAND gate passes a positive write pulse to the output of T1 inhibit circuit 1505.

Assume now that lockout generator 1510 goes to the lockout condition and applies a low condition to the $\overline{L}$ lead and a high condition to the L lead as described hereinafter. The low condition on the $\overline{L}$ lead maintains both NAND gate 2805 and 2802 disabled thereby enabling NAND gate 2803 and thus maintaining a low condition output for T1 inhibit circuit 1505. The high condition on lead L partially enables NAND gate 2804 and inverter 2807 passes a low condition to the clock input of flip-flop 2801. When the negative write request pulse is received from T1 counter 1502, the inversion thereof passed by way of inverter 2806 momentarily fully enables NAND gate 2804. This drives flip-flop 2801 to the set condition partially enabling NAND gate 2802. NAND gates 2805 and 2802, however, have been disabled by the low condition on lead $\overline{L}$ precluding the generation of the write signal. This condition is maintained during lockout. At the termination of lockout, however, the restoration of the high condition to the lead $\overline{L}$ enables NAND gate 2802 which thereby disables NAND gate 2803. Inverter 2807 inverts the restored low condition on lead L whereby flip-flop 2801 is clocked to the clear state. This disables NAND gate 2802 which again enables NAND gate 2803. NAND gate 2803 having been momentarily disabled thereby generates a write signal at the termination of the lockout mode in response to the reception of the write request signal from T1 counter 1502 during the lockout mode.

Figure 29:
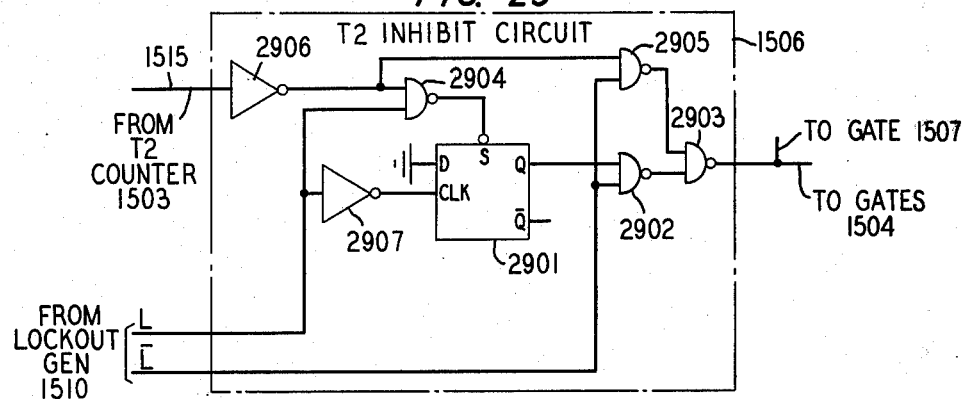

T2 inhibit circuit 1506 shown in detail in FIG. 29 is arranged in the same manner as T1 inhibit circuit 1505 with the exception that it is driven by the write request signal from T2 counter 1503 rather than from T1 counter 1502. T2 inhibit circuit 1506 therefore generates write signals in response to the write request signals from T2 counter 1503.

Figure 30:
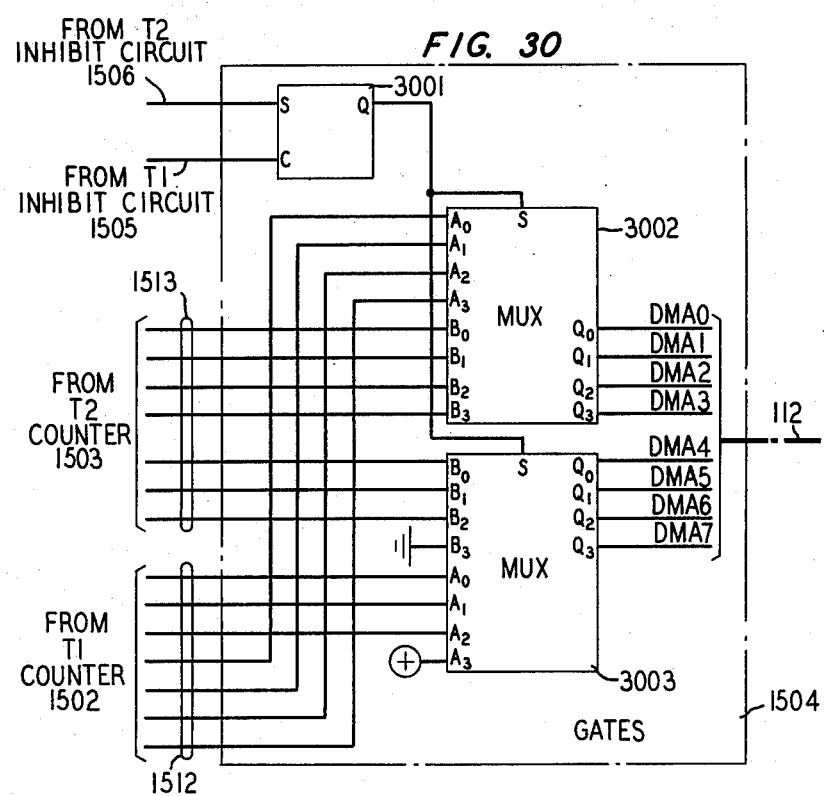

Gates 1504 are shown in detail in FIG. 30. The principal components of gates 1504 comprises multiplexers 3002 and 3003 and flip-flop 3001. When the write signal is received from T1 inhibit circuit 1505, flip-flop 3001 is driven to the clear condition. The low output at the Q terminal of flip-flop 3001 is passed to the S input terminal of multiplexers 3002 and 3003. This selects the input terminal A0–A3 of both multiplexers extending the information provided thereto to the output terminals of the multiplexers and thus to multiple output leads 112. Under this condition it can be seen that the information on multiple leads 1512 from T1 counter 1502 is passed to multiple leads 112 and thus the T1 number is passed to microcomputer 110. Additionally, a high condition flag bit from input terminal A3 is also passed to multiple leads 112 to designate the application of the T1 count to the leads. When a write signal is received from T2 inhibit circuit 1506, flip-flop 3001 is set and its high output condition selects the input terminals B of multiplexers 3002 and 3003. Accordingly, the T2 number on multiple leads 1514 from T2 counter 1503 is passed to multiple leads 112 together with a low condition flag bit applied to input terminal B3.

Figure 32:
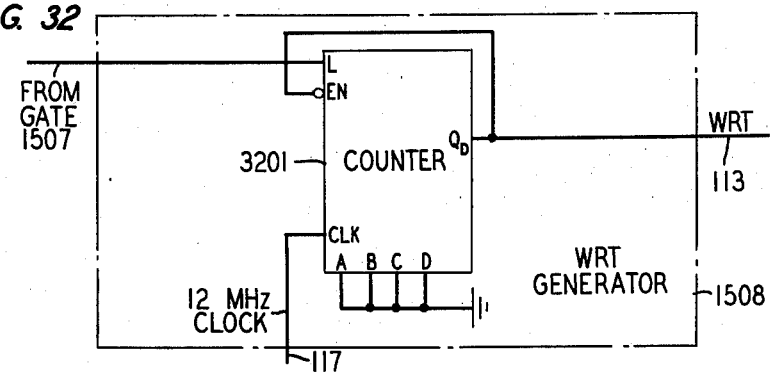

The details of write generator 1508 are shown in FIG. 32. The principal component of WRT generator 1508 comprises counter 3201. The output of counter 3201 at terminal $Q_D$ is low during each of its several counts with the exception of a predetermined count (such as the count of 8) when the output goes high. Assuming that counter 3201 has reached this predetermined count, the high condition at its output is passed to write lead 113 and also is fed to input terminal EN to disable the counter. The write signal, from T1 inhibit circuit 1505 or T2 inhibit circuit 1506, inverted by NOR gate 1507 is applied to the load input of counter 3201. This inverted write signal thereupon loads a "0" count into counter 3201 bringing the $Q_D$ output low to thereby enable the counter. Counter 3201 thereupon is incremented by the 12 MHz clock pulses on lead 117 until the predetermined count is achieved, restoring the high condition output of counter 3201 and again disabling the counter. The resultant output of WRT generator 1508 is therefore a negative write pulse applied to lead 113 in response to the write signal from T1 inhibit circuit 1505 or T2 inhibit circuit 1506 received by way of NOR gate 1507.

Figure 33:
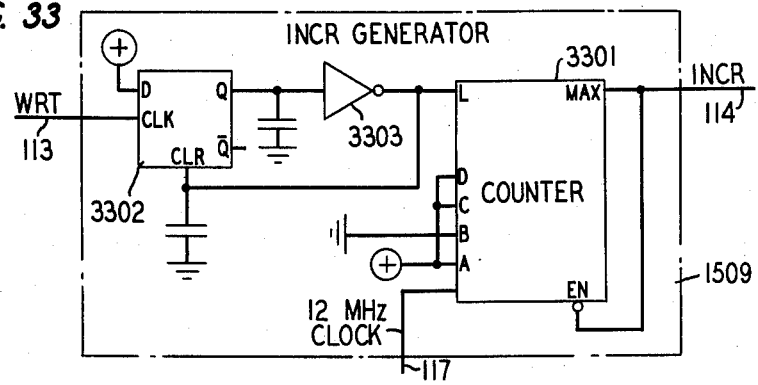

The details of INCR generator 1509 are shown in FIG. 33. Assume that counter 3301 in INCR generator 1509 has reached its maximum count. Output MAX thereby provides a high potential to output lead 114 and, in addition, this high potential maintains counter 3301 disabled. When the trailing edge of the write pulse is received from WRT generator 1508, flip-flop 3302 is clocked to the set condition. The high output at the Q terminal of flip-flop 3302 is inverted by inverter 3303 and the consequent low condition is passed after a delay to the CLR input of flip-flop 3302 and to the load input of counter 3301. Flip-flop 3302 is restored to the clear condition and a predetermined number (such as 13) is loaded into counter 3301. Since counter 3301 is no longer at the maximum count, the output goes low and counter 3301 is enabled and thereby incremented by the 12 MHz clock pulses on lead 117. When counter 3301 again achieves the maximum count, its output goes high again disabling the counter. The consequent output of INCR generator 1509 in response to the write pulse on lead 113 is therefore a negative-going pulse provided to lead 114 after the write pulse terminates.

Figure 34:
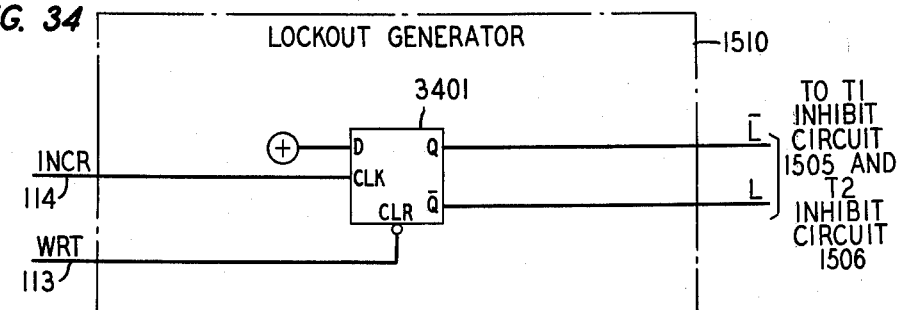

The details of the lockout generator are shown in FIG. 34, the principal component being flip-flop 3401. Flip-flop 3401 is normally in the set condition. A high condition is thereby normally applied by its Q output to lead $\overline{L}$ and a low condition is normally applied by its $\overline{Q}$ output to lead L, which leads, as previously noted, extend to T1 inhibit circuit 1505 and T2 inhibit circuit 1506. When the write pulse is generated and applied to lead 113, it clears flip-flop 3401, reversing conditions on lead L and $\overline{L}$; that is, applying a high condition to lead L and a low condition to lead $\overline{L}$. Thereafter, the trailing edge portion of the increment pulse on lead 114 clocks flip-flop 3401 back to the set condition, restoring a high condition on lead $\overline{L}$ and a low condition on lead L. The lockout condition is thereby applied to leads L and $\overline{L}$ during the write and increment pulse durations.

Although a specific embodiment of this invention has been shown and described, it will be understood that various modifications may be made without departing from the spirit of this invention.

APPENDIX

```
;********
;           10-13-75
;********
;
;         THE FOLLOWING ROUTINE CALCULATES ISOCHRONOUS DISTORTION
;         ON THE BASIS OF DATA LOAD TO RAM BY A DMA
;
;         THE DMA IS ENTERED UNDER SOFTWARE CONTROL (CALL DMA)
;         TWO TYPES OF DATA ARE ENTERED TO RAM
;         T1 TIME FROM RD-LEAD TO MIDBIT  (BIT7=1,BIT0-6=DATA)
;         T2 TIME FROM RD-LEAD TO RD-TRAIL (BIT7=0,BIT0-6=DATA)
;
;         THE PROGRAM CONSISTS OF EIGHT BASIC PARTS
;
;         1.)   SET DATA ACCESS SWITCH FOR CSU AND ISO. DIS.
;                  AND LED1 to ASSIGN CONTROL1
;                  (2,2,9,5,9,9)
;
;         2.)   INITIALIZE PARAMETERS
;
;         3.)   SET CLOCK FOR CSU BAUD RATE
;
;         4.)   READ LATCHED KEYBOARD FOR DATA DISPLAY AND
;                  DATA ENTRY MODE
;
;         5.)   INITIALIZE HISTOGRAM PARAMETERS
```

```
;            6.)    MEASURE ISOCHRONOUS DISTORTION (RD-LEAD THEN RD-TRAIL)
;                       A. DMA DATA TO RAM
;                       B. READ MPW (MEDIAN PULSE WIDTH)
;                       C. BUILD HISTOGRAMS (LOOP TO A)
;                       D. CALCULATE ISO. DIS.  (RD-LEAD DISTORT THEN RD-TRAIL;
;                            LOOP TO 5 AFTER RD-LEAD PROCESSING)
;
;            7.)    SET ISO. DIS. = MAX( RD-LEAD DISTORT, RD-TRAIL DISTORT)
;                       SET DISPLAY FLAG
;
;            8.)    DISPLAY DATA  (LOOP TO 4)
;
;********
;********
;
;
;            COMMON SUBROUTINES CALLED BY ISO. DIS. ROUTINE
;                    CLCSU
;                    DSPDB
;                    BNAS5
;                 B2A
;                    MUL
;                    DIV
;                    BMTM
;                    ZERO
;                    BM
;                 .  SWFCK
;
;
;            COMMON FLAGS AND RAM USED
;       .           STACK
;                   ARSWF (UNCHANGED)
;                   DSSPD (UNCHANGED)
;                   TCDE (SET TCDE=0)
;                   DISBF TO DISBF+37Q
;
;
;
;
;            ALLOCATION OF RAM STORAGE ON PAGE 71 FOR ISO. DIS.
;            (DMA DATA IS LOADED TO 72Q,73Q)
;
HISTE     EQU 256*71Q              ;EARLY HISTOGRAM
HISTL     EQU HISTE+100             ;LATE HISTOGRAM
DP        EQU HISTL+100              ;DISCARDED PULSE COUNT
MID       EQU DP+2                 ;MAX ISO. DIS.
ME        EQU MID+1                  ;MAX EARLY
ML        EQU ME+1             ;MAX LATE
ZERID     EQU    ML+1                ;ALTERNATE ZERO I.D. BETWEEN EARLY → L
                                    ;0=LATE,1=EARLY
DFLG      EQU ZERID+1;DISPLAY FLAG (DISP FORMAT)
MPW       EQU DFLG+1                ;MPW
MPW2      EQU MPW+1                 ;MPW*.5
IE        EQU MPW2+1                ;EARLY CNT(DO LOOP,DOWN CTR)
IL        EQU IE+2            ;LATE CNT(DO LOOP,DOWN CTR)
N         EQU    IL+2               ;TOTAL E OR L COUNT
ALPHA     EQU N+2 ;NUMBER OF OUTLIERS
BETA      EQU    ALPHA+1             ;NUMBER OF DP BEFORE * DISPL
Y         EQU BETA+1               ;FACTOR FOR THE *100 CLK
X         EQU Y+1            ;Y/X IS THE CORRECTION
DIS       EQU X+1             ;DISTORTION VALUE
ID        EQU DIS+1                 ;ISO DIS
TOGL      EQU ID+1                  ;DISPLAY TOGGLE (NO LONGER USED 12/11/75
LTFLG     EQU TOGL+1                 ;LEAD TRAIL CONTROL FLG
LTDIS     EQU LTFLG+1                ;DISPLAY LE OR TE
IDL       EQU LTDIS+1               ;ISO DIS FOR RDL
IDT       EQU IDL+1                 ;ISO DIS FOR RDT

;
;           DEFINE PROGRAM CONSTANTS
;
ALPHV     EQU       50              ;ALPHA VALUE--OUTLIERS OF HISTOGRAM FOR ISO DIS
BETAV     EQU       25              ;BETA VALUE--DP COUNT CAUSING QUESTION MARK
NV        EQU      1000             ;N VALUE--DISTORTION SAMPLES PER HISTOGRAM
```

```
;               THE FOLLOWING PARAMETERS ARE USED IN CONVERTING
;               THE ≡NEARLY≡ X100-CLOCK TO A ≡TRUE≡ X100 BY
;               MULTIPLYING BY Y/X
;
X2400       EQU     99
X4800       EQU     100
X9600       EQU     97
X56K        EQU     108
YV          EQU     100
F24         EQU     24
F96         EQU     96
F56         EQU     56
;
;               DEFINE I/O PORTS
;
MPWA        EQU     21Q             ;LOWER 4 BITS MPW2
MPWB        EQU     22Q             ;UPPER 2  ≡   ≡
LATKY       EQU     25Q             ;LATCHED KEYBOARD INPUT
LKBD        EQU     30Q             ;LATCHED KEYBD RESET AND ASSIGN CNTR OUT

;********
;   1.) MAKE CROSS CONNECTIONS FOR CSU (RD TO CLOCK) OR
;       BYPASS FOR MANUAL CROSS CONNECT
;********
;
;
ISODS:  LXI     H,IDSW
        CALL    SWFCK                   ;CLOSE SWS, A=2, B=2
                                        ;AND (A,B)=(9,5),(9,9)
                                        ;RD TO CLOCK;LED1 TO CNTRL1

;********
;   2.) INITIALIZE PARAMETERS AND KEYBD LATCHES
;********
;
INITP:  LXI     H,ALPHA
        MVI     M,ALPHV                 ;LOAD ALPHA VALUE
        INX     H                       ;POINT TO BETA LOC
        MVI     M,BETAV                 ;LOAD BETA VALUE
        INX     H                       ;POINT TO Y
        MVI     M,YV                    ;LOAD Y VALUE
          LXI     H,NV                  ;LOAD N VALUE
          SHLD    N                     ;INITIALIZE N
;
;       ZERO ALL RAM SCRATCH AREA *BELOW* DFLAG---
;       E-HISTO,L-HISTO,AND DFLG,MID,ME,ML,ZERID
;
        LXI     H,DFLG
        CALL    ZERO
;
;       RESET KEYBOARD LATCHES
;
        CALL    RSKL
;
;       TEST FOR FREQUENCY AND SET X
;
        LXI     H,X             ;PT TO X
        LDA     DSSPD           ;TEST FOR F=2.4,9.6,56 ALTER X
        MVI     M,X2400         ;ASSUME 2400 B/S
        CPI     F24
        JZ      CCLK            ;CORRECT ASSUMPTION
        MVI     M,X9600         ;ASSUME 9600
        CPI     F96
        JZ      CCLK            ;CORRECT
        MVI     M,X56K          ;ASSUME 56K
        CPI     F56
        JZ      CCLK            ;CORRECT
        MVI     M,100           ;MUST BE 4800, X100 NOMINAL

;********
;   3.) SET CLOCK AND DELAY FOR PLL RECOVERY
;********
```

```
;
CCLK:       CALL    CLCSU           ;SET CLOCK
            MVI     A,377Q          ;SET UP PORT FOR CSU
            OUT     24Q
            LXI     H,MESI2
            CALL    BMTM            ;DISPLAY RECVRY MESS → DELAY
;
;********
;     4.) READ LATCHED KEYBOARD AND INITIALIZE HISTO PARAMS
;         LATCHED KEYS ON INPUT PORT LATKY
;         KEYA=BIT 4  (NOMINAL DISPLAY)
;         KEYB=BIT 5  (EXTENDED DISPLAY)
;         KEYC=BIT 6  (CLEAR MAXIMUMS)
;
;********
;
RDKY:       IN      LATKY           ;READ LATCHES
            MOV     B,A             ;B=LATCHES
            ANI     020Q            ;EXAMINE KEY A
            JZ      EXMB
            SUB     A               ;A=0
            STA     DFLG            ;DFLG=0 (NORMAL DISPLAY)
            JMP     EXMC
EXMB:       MOV     A,B             ;EXAMINE KEY B
            ANI     040Q
            JZ      EXMC
            STA     DFLG            ;DFLG NOT ZERO
EXMC:       MOV     A,B             ;EXAMINE KEY C
            ANI     100Q
            JZ      EXMD
            LXI     H,ML            ;CLEAR MID,ME,ML
            CALL    ZERO
EXMD:       MOV     A,B
            ANI     200Q
            NOP                     ;THE FOLLOWING THREE
            NOP                     ;LOCATIONS ARE ALLOCATED FOR
            NOP                     ;A *CNZ* FOR VARIABLE INPUT
;
;           RESET KEYBOARD
;
            CALL    RSKL
;
;
;           INITIALIZE LTFLG=RDL,RDT CONTROL
;
            SUB     A               ;A=0
            STA     LTFLG           ;LTFLG=0
;
;********
;     5.) ZERO HISTOS AND INITIALIZE IE,IL AND DP
;********
;
INITH:      LXI     H,DP+1          ;ZERO DP AND HISTOS
            CALL    ZERO
            LHLD    N               ;LOAD N
            SHLD    IE              ;SET EARLY DOWN COUNT
            SHLD    IL              ;SET LATE DOWN COUNT
;
;********
;     6.) THE FOLLOWING SECTION OF CODE, FROM *CALL DMA* TO
;         *CALL ISOD* ANALYZES DMA DATA, CREATES HISTOGRAMS
;         AND CALCULATES LEAD OR TRAIL DISTORTION , MAX ISO. DIS,
;         MAX EARLY DIS.,MAX LATE DIS., AND NUMBER OF *DISCARDED
;         PULSES*.
;********
;
CDMA:       MVI     A,4             ;LIGHT ASSIGN LEDS
            OUT     LKBD
            CALL    DMA             ;INPUT DISTORTION DATA (DMA)
                                    ;NOMINALLY 256 T1
                                    ;AND 256 T2 ... ALTERNATING
            CALL    RSK1            ;TURN OFF LIGHTS
            CALL    RMPW            ;READ MPW BY STATISTICAL METH.
            CALL    FST1            ;FIND FIRST T1
```

```
CT1T2:    CALL      T1T2              ;T1 THEN T2 ... AND T1<T2
                                      ;T1 IN B; T2 IN C
                                      ;CY=1 FOR ERROR
;
;         THE FOLLOWING SECTION OF CODE (TO LABLE CT1)
;         TESTS FOR DISCARDED PULSES ; INCREMENTS DP;
;         DISPLAYS MESSAGE FOR DP>N
;
          JNC       CT1               ;GOOD PULSE  PROCEED
          LHLD      DP                ;BAD PULSE INC DP
          INX       H
;
;         TEST FOR DP>N
;
          LDA       N+1               ;LOAD MSB OF N
          CMP       H                 ;MSB DP = MSB N ?
          JNZ       CSHL              ;JMP FOR DP<N
          LDA       N                 ;LOAD LSB OF N
          CMP       L                 ;LSB DP = MSB N ?
          JNZ       CSHL              ;JMP FOR DP<N
          LXI       H,MESI5           ;EXCESS -- DISPLAY ERROR MESS.
          CALL      BMTM
          JMP       RDKY              ;START OVER
CSHL:     SHLD      DP                ;DP BACK TO RAM
          JMP       TEL               ;JMP TO TEST FOR PROCESS COMPLETE
CT1:      LDA       LTFLG             ;LOAD RDL,RDT CONTROL
          ANA       A                 ;SET FLGS
          JZ        PROC1             ;LTFLG=0 THEN PROCESS RDL
          CALL      IDT2              ;LTFLG=1 PROCESS RDT
          CALL      HISTO             ;UPDATE HISTOS
          JMP       TEL               ;TEST FOR PROCESS COMPLETE
PROC1:    CALL      IDT1              ;PROCESS RDL
          CALL      HISTO             ;UPDATE HISTOS
;         TEST IE AND IL  FOR  FULL HISTOS
;
TEL:      LHLD      IE                ; EXAMINE IE
          CALL      ZHL               ; CY=1 FOR HL =0
          JNC       TPAG              ; MORE DATA FOR HISTOS
          LHLD      IL                ; EXAMINE IL
          CALL      ZHL
          JNC       TPAG              ; MORE DATA FOR HISTOS
          CALL      ISOD              ; HISTOS FULL, CALC. ISO. DIS.
          LDA       LTFLG             ;RDT BEEN TESTED ?
          ANA       A                 ;SET FLGS
          JNZ       IDEND             ;LTFLG=1 MEANS RDT PROCESSED
          INR       A                 ;A=1
          STA       LTFLG             ;LTFLG=1
          LDA       ID
          STA       IDL               ;IDL=ID
          JMP       INITH             ;GO PROCESS RDT
;
;
;         TEST FOR END OF DMA DATA, DE =RAM PTR =73Q,376Q
;         THE RAM PTR TO DMA DATA IS STORED IN DE DURING
;         ALL DATA ANALYSIS IN THE ≡CDMA LOOP≡.THOSE SUBROUTINES
;         CALLED IN THIS LOOP PRESERVE DE.
;
TPAG:     MOV       A,D               ;A=PAGE PTR (STORED IN D)
          CPI       73Q               ;DMA RAM, PAGES 72Q,73Q
          JC        CT1T2             ;PAGE 73Q?
          MOV       A,E               ;BYTE PTR TO A
          CPI       376Q              ;PAGE BNDRY-2 ?
          JC        CT1T2             ;PTR≥(73Q,376Q) MEANS DMA PROCESSED
          JMP       CDMA              ;GET NEW DMA DATA
;
;********
;   7.) SET ISO. DIS. = MAX (RDL-DISTORT, RDT-DISTORT)
;       SET LTDIS FLG FOR DISPLAY
;********
;
IDEND:    LDA       ID
          STA       IDT               ;IDT=ID
          MVI       A,20              ;PRESET LTDIS
          STA       LTDIS             ;LTDIS=T (ASCII)
          LDA       IDL               ;FIND MAX DISTORT
```

```
            MOV       B,A                ;B=IDL
            LDA       IDT                ;A=ID (RDD-DISTORT)
            CMP       B                  ;ID-RDL   ID-RDD ?
            JNC       DSPLY              ;ID-RDD GREATER ... DISPLAY
            MOV       A,B                ;ID-RDL GREATER ... ALTER ID, LTDIS
            STA       ID                 ;ID=IDL=ID-RDL
            MVI       A,12               ;ALTER LTDIS
            STA       LTDIS              ;LTDIS=L (ASCII)

;
;********
;     8.) DATA ANALYSIS COMPLETE, DISPLAY DATA
;********
;
DSPLY:      LDA       DFLG               ; DETERMINE DISPLAY MODE
            ANA       A                  ; SET FLAGS
            CZ        DNOM               ; DFLG =0 FOR NORMAL DISPLAY
            LDA       DFLG
            ANA       A
            CNZ       DEXT               ; DFLG=1 FOR EXTENDED DISPLAY
            JMP       RDKY               ; MAKE NEW MEASUREMENT
;
;********
;********************      SUBROUTINES      *********
;********
;
;
;
;************************
;        SUBROUTINE CONV   CONVERTS A=A*Y/X
;************************
;
CONV:       PUSH      B                  ;SUBS MUL AND DIV
            PUSH      D                  ;USF BC AND DE
            MOV       C,A                ;C =A
            LDA       Y
            MOV       D,A                ;D =Y
            CALL      MUL                ;BC=C*D
            LDA       X
            MOV       D,A                ;D =X
            CALL      DIV                ;C =BC/D
            MOV       A,C                ;A =A*Y/X
            POP       D
            POP       B
            RET
;
;
;************************
;        SUBROUTINE DNOM PRODUCES THE NORMAL DISPLAY
;        DISPLAY ISO. DIS. and PULSE
;************************
;
DNOM:       LXI       H,MESI2            ;PT TO MESI2
            CALL      BM                 ;LOAD BUFFER
            LDA       DP+1               ;A=MSB DP
            ANA       A                  ;SET FLGS
            JNZ       QST                ;DISPLAY > FOR DP>255
            LDA       BETA               ;A=BETA
            MOV       B,A                ;B=BETA
            LDA       DP                 ;A=LSB DP
            CMP       B                  ;DP<BETA?
            JC        LDID               ;JMP FOR DP<BETA
QST:        LXI       H,DISBF            ;PT TO 1ST CHAR OF DISPLAY
            MVI       M,"*"              ;* TO BUFFER
LDID:       LDA       ID                 ;A=ID
            LXI       H,DISBF+13         ;POINT TO ID SLOT
            CALL      B2A                ;ID TO MESSAGE BUFFER
            LDA       MPW                ;A = MPW
            CALL      CONV               ;NORMALIZE X100 CLOCK
            LXI       H,DISBF+23         ;PT TO MPW SLOT
            CALL      B2A                 ;MPW TO MESSAGE BUF
            LDA       LTDIS              ;LOAD L OR T TO DISPLAY
            STA       DISBF+10
            JMP       DSPDB              ;DISPLAY MESSAGE
```

```
;************************
;         SUBROUTINE DEXT PRODUCES THE EXTENDED DISPLAY
;         DISPLAY --- MID, LED, TED, DP
;************************
DEXT:     LXI       H,MESI3           ;PT TO MESI3
          CALL      BM                ;LOAD BUFFER
          LDA       MID               ; MAX ID TO A
          LXI       H,DISBF+18        ;PT TO MID SLOT
          CALL      B2A
          LDA       IDL               ; A = IDL
          LXI       H,DISBF+3         ;PT TO LED SLOT
          CALL      B2A               ;LED TO MESSAGE BUF
          LDA       IDT               ; A=IDT
          LXI       H,DISBF+10        ;PT TO LED SLOT
          CALL      B2A               ;LED TO MESSAGE BUF
          LHLD      DP
          LXI       D,DISBF+25
          CALL      BNAS5
          JMP       DSPDB             ;DISPLAY MESSAGE
;
;************************
;         SUBROUTINE FST1 FINDS THE FIRST T1 IN THE DMA DATA
;************************
;
FST1:     LXI       H,256*71Q+377Q   ;PT TO DMA RAM
FST11:    INX       H
          MOV       A,M               ; A = DATA
          ANI       200Q              ; MASK FOR FLAG
          JZ        FST11
          XCHG
          RET                         ; RET WITH RAM PTR IN DE
;
;************************
;         SUBROUTINE HISTO UPDATES THE HISTOGRAM
;         FOR EARLY (IE>0) OR LATE (IL>0)
;         OR RETURNS FOR A FULL HISTOGRAM
;
;         THE HISTOGRAMS ARE SINGLE PRECISION,
;         THUS BINS SATURATE AT 255.
;************************
;
HISTO:    JNC       HLATE             ; JUMP TO LATE BRANCH
          CALL      CONV              ; CONVERT EARLY TO X100CLK
          CALL      MAXE              ;TRUNCATES AND UPDATES
          STA       DIS               ; TEMP STORE DIST. VALUE
          LHLD      IE                ; EXAMINE IE
          CALL      ZHL               ; E=0
          RC                          ; CY=1,IE=0
          DCX       H                 ; IE =IE-1
          SHLD      IE                ; IE TO RAM
          JMP       JOIN              ; BRANCH TO COMMON PROC.
HLATE:    CALL      CONV              ; CONVERT LATE TO X100 CLK
          CALL      MAXL              ;TRUNCATES AND UPDATES
          ADI       100               ; LATE HISTO IN 100-199
          STA       DIS
          LHLD      IL                ; EXAMINE  IL
          CALL      ZHL               ; E =0
          RC                          ; CY=1,IL=0
          DCX       H                 ; IL=IL-1
          SHLD      IL                ; IL TO RAM
JOIN:     MVI       H,71Q
          LDA       DIS               ; A=HISTO BIN NO.
          MOV       L,A               ; HL PT TO HISTO BIN
          INR       M
          RNZ                         ; BIN NOT SATURATED RET
          MVI       M,377Q            ; BIN =377Q (SATURATED)
          RET
;
;************************
;         SUBROUTINE ISOD SUMS THE EARLY AND LATE HISTOS
;         UNTIL  SUM>ALPHA. THIS POINT DEFINES EARLY DISTORTION
;         OR LATE DISTORTION.
;         ISO. DIS. = EARLY DIS. + LATE DIS.
;         ISO. DIS. RETURNED IN  A AND ID
;************************
```

```
;
ISOD:       LXI     H,256*71Q+99    ;PT TO TOP OF E-HISTO
            MVI     C,0             ;C=BOTTOM OF HISTO= 0
            CALL    SUMI            ;SUM UNTIL SUM>ALPHA
            MOV     D,L             ;STORE EARLY DIS. IN D
            MVI     L,199           ;PT TO TOP OF L-HISTO
            MVI     C,100           ;C=BOTTOM OF HISTO= 100
            CALL    SUMI            ;SUM UNTIL SUM>ALPHA
            MOV     A,L             ;A=(LATE DIS + 100)
            SUI     100             ;A=LATE DIS
            ADD     D               ;A=ISO. DIS.=E=DIS.+L-DIS.
            CPI     99              ;TEST FOR ISO. DIS.>99
            JC      STID            ;CY=1 FOR A<99
            MVI     A,99            ;LIMIT ISO. DIS. TO 99
STID:       STA     ID              ;ID=ISO. DIS.
            LXI     H,MID           ;CALCULATE MAX ISO. DIS.
            CMP     M
            RC                      ;ISO. DIS. < MID
            MOV     M,A             ;UPDATE MID
            RET
;
;************************
;       SUBROUTINES MAXE AND MAXL UPDATE ME AND ML
;       DISTORTION VALUE IS PASSED IN ACC.
;       HL IS EFFECTED BY ROUTINE
;       MAX VALUE LIMITED TO 99 AND RETURNED TO RAM AND A
;************************
;
MAXE:       LXI     H,ME            ;PT TO ME
            JMP     MAXE1
MAXL:       LXI     H,ML            ;PT TO ML
MAXE1:      CPI     99              ;DISTORT > 99
                                    ;CY=1 FOR A<99
            JC      MAX1
            MVI     A,99
MAX1:       CMP     M               ;DISTORT > MAX
            RC                      ;RET FOR CY =1,A<MAX
            MOV     M,A             ;MAX = DISTORT
            RET
;************************
;       SUBROUTINE RMPW READS 5*MPW FROM THE CLOCK RECOVERY
;       CIRCUITRY. SINCE THE DATA MAY BE UNSTABLE MULTIPLE
;       READS OF THE DATA ARE TAKEN THEN 5*(MAX+MIN) IS
;       ACCEPTED AS A VALID READ FOR (MAX-MIN))5
;************************
;
RMPW:       LXI     B,256*255+4     ; B=255,  C=4
RMP1:       LXI     H,255           ;MAX=0, MIN=255
RMP4:       CALL    REDIT           ;READ  .5*MPW TO A
            CMP     H               ;MAX>READ
            JC      RMP2            ;CY=1 FOR A>MAX
            MOV     H,A             ;NEW MAX
RMP2:       CMP     L               ;MIN)READ
            JNC     RMP3            ;CY=0 FOR A≥MIN
            MOV     L,A
RMP3:       DCR     C               ;TAKE 4 READS
            JNZ     RMP4
            MOV     A,H             ; A=MAX
            SUB     L               ; A+MAX-MIN
            CPI     6               ; IS (MAX-MIN)> 6
            JC      RMP5            ; CY=1 FOR A)5
            MVI     C,4             ; INIT C
            DCR     B
            JNZ     RMP1            ; NEW READ CYCLE
            LXI     H,MESI4
            CALL    BMTM            ; DISPLAY ERROR MESSAGE
            JMP     RMPW            ; START OVER
RMP5:       MOV     A,H             ; VALID READ CALC MPW A=MAX
            ADD     L               ; A = MAX + MIN < (256)
            STA     MPW             ; STORE MPW
            RAR                     ; MPW/2
            ANI     177Q            ; STRIP BIT7
            STA     MPW2            ; STORE MPW/2
            RET
```

;**************************
;       SUBROUTINE REDIT READS MPW/2 FROM PORTS MPWA,MPWB
;**************************
;
REDIT:  IN      MPWA
        ANI     17Q             ;LOWER 4 BITS
        MOV     E,A
        IN      MPWB            ;UPPER 4 BITS
        ANI     3
        RLC
        RLC
        RLC
        RLC
        ORA     E               ; A = MPW/2
        RET

;**************************
;       SUBROUTINE SUM SUMS THE TAIL OF THE EARLY
;       OR THE LATE HISTO UP TO ALPHA. THE SUM BEGINS
;       WITH THE RAM PTR SET IN HL. WITH EACH ADD
;       L IS DECREMENTED UNTIL SUM ≥ ALPA OR UNTIL
;       THE BOTTOM OF THE HISTO (C=BOTTOM) IS ENCOUNTERED.
;       THE ROUTINE THEN RETURNS WITH L POINTING TO LAST BIN.
;**************************
;
SUMI:   LDA     ALPHA           ; SUM TO ALPHA
        MOV     B,A             ; B= ALPHA
        SUB     A               ; A = SUM = 0
SUMI1:  ADD     M               ; HL PTS TO HISTO
        RC                      ; RET FOR SUM>377Q
        CMP     B               ; COMPARE SUM TO ALPHA
        RNC                     ; RET FOR SUM ≥ ALPHA
        MOV     E,A             ;STORE SUM IN E
        DCR     L               ; PT TO NEXT BIN
        MOV     A,L             ; BIN PTR TO A
        CMP     C               ; TEST FOR BOTTOM
        RZ                      ; RET FOR BOTTOM
        MOV     A,E             ;RETURN SUM TO A
        JMP     SUMI1

;**************************
;     SUBROUTINE IDT1 CALCULATES EARLY OR LATE
;     FROM T1. RETURN VALUE IN ACCUMULATOR,
;     CY=1 FOR EARLY, CY=0 FOR LATE
;**************************
;
IDT1:   LDA     MPW2            ; A=MPW/2
        SUB     B               ; A=(MPW2-I1) ; B=T1
;
;       MPW2 - T1 IS THE NEGATIVE OF EARLY OR LATE
;       NEG=EARLY,POS=LATE
;
        JZ      ZEROI           ;JMP IF ZERO ID-ZEROI WILL ALTERNATE
                                ;ID BETWEEN AN EARLY AND A LATE
        RNC                     ; RET ON NO CARRY WITH LATE
        CMA                     ; CONVERT FROM TWOS COMP
        INR     A               ; A =A+1
        STC                     ; CY =1 FOR EARLY
        RET

;**************************
;       SUBROUTINE IDT2 CALCULATES EARLY OR LATE
;       FROM T2. RETURN VALUE IN ACCUMULATOR,
;       CY=1 FOR EARLY , CY=0 FOR LATE
;**************************
;
IDT2:   LDA     MPW2            ; A=MPW/2
        ADD     B               ; A =MPW2 + T1 ; B=T1
        SUB     C               ; A = (T1-T2) + MPW2 ; C=T2
;
;       T1-T2+MPW2 IS THE NEGATIVE OF THE E OR L VALUE
;       POS=EARLY,NEG=LATE
;
```

```
            JZ      ZEROI               ;JMP IF ZERO ID-ZEROI ALTERNATES ZERO
                                        ;ID BETWEEN EARLY AND LATE
            JNC     ERLY
            CMA                         ;CONVERT FROM TWOS COMP
            INR     A
            ANA     A
            RET                         ; RET WITH CY =0 FOR LATE
ERLY:       STC                         ; CY =1 FOR EARLY
            RET
;
;************************
;       SUBROUTINE T1T2 CHECKS FOR CONSECUTIVE T1,T2 PAIR
;       AND CHECKS FOR T2>T1. FOR T1,T2 PAIR :
;       VALID DATA = RET WITH B=T1,C=T2,CY=0
;       INVALID DATA = RET WITH CY=1.
;       DE PTS TO NEXT DATA FOR EITHER CASE.
;************************
;
T1T2:       XCHG                        ;RAM PTR FROM DE TO HL
            MOV     A,M                 ;A= DATA (T1 OR T2)
            ANA     A                   ;SET FLAGS
            JP      SETC                ;SET CARRY FOR T2
            ANI     177Q                ;STRIP FLAG
            INR     A                   ;T1+1
            MOV     B,A                 ; B=T1
            INX     H                   ; NEXT DATA
            MOV     A,M                 ; A = DATA
            ANA     A                   ; SET FLAGS
            JM      SETC                ;SET CARRY FOR T1 AFTER T1
            MOV     C,A                 ; C=T2
            CMP     B                   ; T2>T1?
            JNC     NPRO                ;ONLY IF T2<T1 ... PROBABLE ERROR
SETC:       STC                         ;SET CY=1 ERROR ENCOUNTERED IN DATA
NPRO:       INX     H
            XCHG                        ;PTR IN DE
            RET                         ;CY =0 FOR  T1=A)T2=B
;
;************************
;SUBROUTINE ZEROI IS CALLED WHEN AN INDIVIDUAL SAMPLE GIVES 0 ID
;ZERO WILL INSURE THAT THIS SAMPLE IS LOADED ALTERNATELY
;INTO THE LATE ABD TE AND THE EARLY HISTO. IT USES SCRATCH
;ZERID TO KNOW WHICH LOC TO LOAD
;************************
;
;
ZEROI:      LDA     ZERID               ;SEE HOW LAST ZERO ID WAS TREATED
            ANA     A                   ;0 FLAG SET IF LAST ID WAS EARLY (THIS
                                        ;WILL BE A LATE AND CY WILL BE 0)
            CMA                         ;COMPLIMENT*****FLAGS UNAFFECTED
            STA     ZERID               ;STORE COMPLIMENTED ZERID SO NEXT
                                        ;TIME WILL TREAT ZERO ID OPPOSITELY
            MVI     A,0                 ;WANT A=0 FOR RETURN SO WILL STORE
                                        ;AS 0 ID*****NOTE FLAGS HAVE NOT CHANGED
                                        ;SINCE THE ANA A INSTR
            RZ                          ;ANA A CLEARED CARRY-WILL RET AS LATE IF
                                        ;ZERID ENTERED AS 0
            STC                         ;WILL SET CARRY AND RET AS EARLY IF ZERID
                                        ;ENTERED AS 377Q
            RET
;
;************************
;       SUBROUTINE  ZHL  CHECKS HL FOR ZERO
;       ACC AND FLGS DISTROYED
;       CY = 0  FOR   HL>0
;       CY = 1  FOR   HL=0
;************************
;
ZHL         MOV     A,L
            ANA     A
            RNZ                         ;RET FOR L>0,CY=0
            MOV     A,H
            ANA     A
            RNZ                         ;RET FOR H>0,CY=0
            STC                         ;HL=0, CY=1
            RET
```

```
;************************
;       SUBROUTINES RSKL AND RSK1 RESET KEYBOARD LATCHES
;************************
;
RSKL:   SUB     A               ; A=0
        OUT     LKBD            ; RESET LATCHES (BIT2 = RESET)
RSK1:   MVI     A,174Q          ;BIT3,4,5,6=ASSIGN CONTROL
        OUT     LKBD            ; REST CONDITION FOR PORT
        RET
;
;******************************
;       MESSAGES FOR ISO. DIS. TEST
;******************************
;
MESI2:  DB      2,"ISO DIS LE=",2,45Q," PULSE=",2,45Q,1
MESI3:  DB      "LE=",2,45Q," TE=",2,45Q," MAX=",2,45Q," DP =",7
MESI4:  DB      "JITTER ON MPW",19
MESI5:  DB      "EXCESS DP",23
```

We claim:

1. A test set for measuring distortion of incoming pulses comprising means responsive to the incoming pulses for constructing a standard pulse, means for generating digital representations of relative positions in time of the incoming pulses and the standard pulse, means for processing the digital representations of the relative time positions of each of a plurality of the incoming pulses and the standard pulse to obtain the quantity of distortion of the incoming pulse and means for compiling the number of times each distortion quantity is obtained.

2. A test set, in accordance with claim 1, wherein the constructing means comprises a phase lock loop arranged to recover a median pulse from the incoming pulses.

3. A test set, in accordance with claim 1, wherein the means for generating digital representations includes means responsive to the constructing means for determining an interval separating the standard pulse and a point in time and means for measuring an interval separating each of the incoming pulses and the point in time.

4. A test set, in accordance with claim 1, wherein the constructing means includes means for defining at least one edge of the standard pulse and means responsive to the corresponding edges of the incoming pulses for modifying the phase of the defined edge.

5. A test set, in accordance with claim 4, wherein the means for generating digital representations includes means responsive to the constructing means for determining an interval separating a point in time and the modified defined edge and means for measuring an interval separating the point in time and each of the corresponding edges of the incoming pulses.

6. A test set, in accordance with claim 5, wherein the means for generating digital representations further includes first means for generating a digital representation of the interval separating the point in time and the modified defined edge and second means for generating a digital representation of the measured interval between the point in time and each of the corresponding edges of the incoming pulses.

7. A test set, in accordance with claim 6, wherein the processing means includes means for calculating differences between the digital representation generated by the first generating means and the digital representations generated by the second generating means.

8. A test set, in accordance with claim 7, and further including means for displaying representations derived from selected ones of the calculated differences.

9. A test set, in accordance with claim 7, wherein the compiling means includes means for counting number of times individual ones of the differences are calculated.

10. A test set, in accordance with claim 9, wherein the displaying means includes means responsive to the calculated difference counts for selecting ones of the individual differences.

11. A method of measuring jitter distortion of a train of data pulses comprising the steps of:
constructing a median leading and a median trailing edge and a point of time reference at the midpoint thereof from the leading and trailing edges of the data pulses;
generating a first digital representation of the interval between the leading edge of each data pulse and the point of time reference, a second digital representation of the interval between the leading edge of each pulse and the trailing edge thereof and a third digital representation of one-half the interval between the median leading edge and the median trailing edge;
calculating the difference between each of the first digital representations and the third digital representation and the difference between each of the second digital representations and the sum of the corresponding first digital representations and the third digital representation; and
displaying the results of selected ones of the calculations.

12. A method of measuring jitter distortion of a train of data pulses comprising the steps of:
recovering a standard leading edge and a standard trailing edge from leading and trailing edges of the data pulses;
generating digital representations of relative positions in time of each leading edge and each trailing edge of each data pulse and the standard leading edge and the standard trailing edge;
obtaining a distortion quantity of each data pulse from the digital representations of the relative positions of the leading edges and trailing edges of the data pulses and the standard leading and trailing edges; and compiling the number of times individual distortion quantities are obtained.

13. A method of measuring jitter distortion, in accordance with claim 12, wherein the steps of generating digital representations includes the steps of:
defining a point of time reference at a midpoint between the standard leading and trailing edges;
generating a first digital representation of an interval between the reference time and one of the standard edges; and
generating second digital representations of intervals between the reference time and corresponding one of the edges of the data pulses.

14. A method of measuring jitter distortion, in accordance with claim 13, wherein the step of obtaining the distortion quantity of each data pulse includes the step of:
calculating a difference between the first digital representation and each of the second digital representations.

15. A method of measuring jitter distortion, in accordance with claim 14, wherein the step of compiling includes the steps of counting the number of times individual ones of the differences are calculated and displaying representations derived from selected ones of the individual differences in accordance with the several counts thereof.

16. A method of measuring jitter distortion of a train of data pulses comprising the steps of:
recovering a standard pulse from the train of data pulses;
calculating quantities that the data pulses lead and lag the standard pulse;
compiling the number of times individual lead and lag quantities are calculated;
cumulatively summing the compiled number of a largest quantity with the compiled numbers of next successive smaller quantities until a predetermined number is exceeded; and
displaying a digital representation derived from the quantity being summed when the predetermined number is exceeded.

17. A method of measuring jitter distortion in accordance with claim 16 wherein the step of cumulatively summing includes the steps of:
cumulatively summing the compiled number of a largest lead quantity with the compiled numbers of next successive smaller lead quantities until the predetermined number is exceeded; and
cumulatively summing the compiled number of a largest lag quantity with the compiled numbers of next successive smaller lag quantities until the predetermined number is exceeded;
and the step of displaying includes combining the lead and lag quantities being summed when the predetermined number is exceeded.

* * * * *